US008081525B2

(12) United States Patent
Komatsu et al.

(10) Patent No.: US 8,081,525 B2
(45) Date of Patent: Dec. 20, 2011

(54) MEMORY DEVICE INCLUDING COMBINATION SRAM-ROM CELLS AND SRAM CELLS ALTERNATELY ARRANGED AND SEMICONDUCTOR DEVICE INCLUDING THE MEMORY DEVICE

(75) Inventors: Shigeyuki Komatsu, Kyoto (JP); Ichiro Yamane, Kyoto (JP)

(73) Assignee: Panasonic Corporation, Osaka (JP)

( * ) Notice: Subject to any disclaimer, the term of this patent is extended or adjusted under 35 U.S.C. 154(b) by 191 days.

(21) Appl. No.: 12/485,253

(22) Filed: Jun. 16, 2009

(65) Prior Publication Data
US 2009/0323434 A1    Dec. 31, 2009

(30) Foreign Application Priority Data
Jun. 26, 2008    (JP) ................. 2008-167606

(51) Int. Cl.
*G11C 7/00* (2006.01)
(52) U.S. Cl. ......... 365/189.2; 365/51; 365/94; 365/154; 365/185.08
(58) Field of Classification Search .......... 365/51, 365/94, 154, 185.08, 189.2
See application file for complete search history.

(56) References Cited

U.S. PATENT DOCUMENTS

| | | | | |
|---|---|---|---|---|
| 4,922,441 A | * | 5/1990 | Tsukagoshi et al. | 716/125 |
| 5,027,319 A | * | 6/1991 | Lai | 365/156 |
| 5,365,475 A | * | 11/1994 | Matsumura et al. | 365/154 |
| 5,388,076 A | * | 2/1995 | Ihara | 365/200 |
| 5,432,742 A | * | 7/1995 | Ihara et al. | 365/189.2 |
| 5,528,534 A | | 6/1996 | Shoji | |
| 5,598,365 A | | 1/1997 | Shoji | |
| 5,870,326 A | | 2/1999 | Schuelein | |
| 5,923,582 A | | 7/1999 | Voss | |
| 6,002,607 A | | 12/1999 | Dvir | |
| 6,041,008 A | | 3/2000 | Marr | |
| 6,128,218 A | * | 10/2000 | You et al. | 365/156 |
| 6,208,581 B1 | | 3/2001 | You | |
| 6,826,073 B2 | | 11/2004 | Liaw et al. | |
| 7,301,828 B2 | | 11/2007 | Dudeck et al. | |
| 7,324,364 B2 | | 1/2008 | Dudeck et al. | |
| 7,411,808 B2 | | 8/2008 | Chang | |
| 2004/0004882 A1 | | 1/2004 | Liaw et al. | |

FOREIGN PATENT DOCUMENTS

| | | |
|---|---|---|
| JP | 63-053798 A | 3/1988 |
| JP | 2000-132973 A | 5/2000 |
| JP | 3281793 B2 | 2/2002 |
| JP | 2007-234211 A | 9/2007 |
| JP | 2007-235140 A | 9/2007 |

OTHER PUBLICATIONS

English language Abstract of JP 63-053798 A, Mar. 8, 1988.
English language Abstract of JP 2000-132973 A, May 12, 2000.
English language Abstract of JP 8-273386 A, Oct. 18, 1996.
English language Abstract of JP 2007-234211 A, Sep. 13, 2007.
English language Abstract of JP 2007-235140 A, Sep. 13, 2007.

* cited by examiner

*Primary Examiner* — VanThu Nguyen
(74) *Attorney, Agent, or Firm* — Greenblum & Bernstein, P.L.C.

(57) ABSTRACT

A combination memory device including a static random access memory (SRAM) and a read only memory (ROM) comprises first memory cells and second memory cells arranged in rows and columns, in which each of the first memory cells includes an SRAM cell and a ROM cell and is arranged adjacent to at least one of the second memory cells, and each of the second memory cells includes an SRAM cell and does not include a ROM cell.

20 Claims, 22 Drawing Sheets

| Contact placement | | | NA0 | OUT |
|---|---|---|---|---|
| Bit line 142A | Bit line 142B | Bit line 142C | | |
| 1 | 1 | 1 | 1 | 0 |
| | | | 0 | 0 |
| 1 | 1 | 0 | 1 | 0 |
| | | | 0 | 1 |
| 1 | 0 | 1 | 1 | 1 |
| | | | 0 | 0 |
| 0 | 1 | 1 | 1 | 1 |
| | | | 0 | 1 |

395

MEMORY DEVICE INCLUDING COMBINATION SRAM-ROM CELLS AND SRAM CELLS ALTERNATELY ARRANGED AND SEMICONDUCTOR DEVICE INCLUDING THE MEMORY DEVICE

BACKGROUND OF THE INVENTION (1) Field of the Invention

The present invention relates to combination memory devices and semiconductor devices, and in particular to a combination memory device provided with a static random access memory (SRAM) and a read only memory (ROM).

(2) Description of the Related Art

In recent years, the degree of integration of system LSIs has been improving every year along with higher performance of sets and finer processes. In particular, a remarkable improvement can be seen in an amount of a volatile memory such as a static random memory (hereinafter referred to as SRAM or RAM) installed in the system LSI, and a non-volatile memory such as a read only memory (hereinafter referred to as ROM), a flash memory, and the like.

The volatile memory and the non-volatile memory are combined in installation in the system LSI and a one-chip microcomputer. The area of the combination memory region used for the volatile memory and the non-volatile memory in the system LSI and the one-chip microcomputer is relatively large compared to the entire area of the system LSI and the one-chip microcomputer. Thus, the area of a semiconductor chip is determined by how much the area of the combination memory region is miniaturized.

To this end, Patent Reference 1: Japanese Unexamined Patent Application Publication No. 63-53798 discloses a combination memory device provided with a memory cell including an SRAM and a ROM.

FIG. 19 shows a configuration of a combination memory device 900 described in Patent Reference 1. The combination memory device 900 as shown in FIG. 19 includes memory cells 910 arranged in a matrix.

FIG. 20 is a circuit diagram which shows a configuration of the memory cell 910.

As shown in FIG. 20, the memory cell 910 includes an SRAM cell 120 and a ROM cell 930. The SRAM cell 120 and the ROM cell 930 are connected to a common word line 140. Further, the SRAM cell 120 is connected to RAM bit lines 141A and 141B, and the ROM cell 930 is connected to a ROM bit line 942.

Further, the ROM cell 930 stores data that is determined by forming or not forming a contact 931 that connects the ROM cell 930 and the ROM bit line 942, for example.

As described above, the conventional combination memory device 900 includes the SRAM and the ROM in the same cell to share an address. With this, the combination memory device 900 has the following three advantages: (i) reduction of costs for an address selection circuit and other peripheral circuits (area reduction); (ii) more flexible processing of a microcomputer by switching between the SRAM and the ROM for an operation; and (iii) implementation of a new feature by installing, on the ROM, a system program of the microcomputer, a test program, or the like which can not be used by a user.

However, although Patent Reference 1 allows area reduction of the peripheral circuits, it is not described in Patent Reference 1 to reduce area of a memory cell region. In other words, there is no description regarding what layout is used to form the memory cell 910.

Here, the area of the combination memory device is determined depending mainly on the area of the memory cell region. More specifically, compared to the case where the SRAM and the ROM are formed separately, how much the area of the memory cell region can be reduced contributes greatly to area reduction of the combination memory device.

Patent Reference 1: Japanese Unexamined Patent Application Publication No. 63-53798 (page 6, FIG. 1)

SUMMARY OF THE INVENTION

Therefore, an object of the present invention is to provide a combination memory device and a semiconductor device which can reduce the area of a memory cell region.

In order to achieve the above-described object, a combination memory device according to the present invention includes a static random access memory (SRAM) and a read only memory (ROM), the combination memory device including first memory cells and second memory cells arranged in rows and columns, in which each of the first memory cells includes an SRAM cell and a ROM cell and is arranged adjacent to at least one of the second memory cells, and each of the second memory cells includes an SRAM cell and does not include a ROM cell.

According to the above configuration, the first memory cell including the SRAM cell and the ROM cell is arranged adjacent to the second memory cell including only the SRAM cell. Accordingly, it is possible to reduce the area of the memory cell region, by placing the ROM cell on a boundary region shared by the first memory cell and the second memory cell, for example.

Further, the combination memory device may further include: a word line which is provided for each row for selecting the SRAM cells and the ROM cells placed in the row; a first bit line and a second bit line each of which is provided for each column, for reading data from the SRAM cells placed in the column and for writing data on the SRAM cells; and a third bit line which is provided for each column for reading data from the ROM cells placed in the column.

According to the above configuration, it is possible to reduce the area of the memory cell region and the area or the peripheral circuits for the combination memory device according to the present invention, by using the word line in common by the SRAM cell and the ROM cell.

Further, the SRAM cell may include: a first inverter having an input terminal connected to a first node, and an output terminal connected to a second node; a second inverter having an input terminal connected to the second node, and an output terminal connected to the first node; a first transistor having a first terminal connected to the first node, a second terminal connected to the first bit line, and a gate connected to the word line, the first terminal being one of a drain and a source, the second terminal being the other of the drain and the source; and a second transistor having a first terminal connected to the second node, a second terminal connected to the second bit line, and a gate connected to the word line, the first terminal being one of a drain and a source, the second terminal being the other of the drain and the source, and the ROM cell may include a third transistor having a source connected to a ground (GND), and a gate connected to the word line, and the ROM cell may output, to the third bit line, data determined depending on whether or not a contact is included, the contact connecting the drain of the third transistor to the third bit line.

Further, a part of a region of the third transistor included in each of the first memory cells may be placed in a region of corresponding one of the second memory cells arranged adjacent to the first memory cell.

According to the above configuration, it is possible to reduce the area of the memory cell region of the combination memory device of the present invention, by placing the ROM cell on the boundary region used in common by the first memory cell and the second memory cell.

Further, in the first memory cells and the second memory cells, the first and second inverters and the first and second transistors may be sequentially placed in order, starting from a first end to a second end, in a column direction, each of the first memory cells and the second memory cells may be placed so that: the first end faces the first end of corresponding one of the first memory cells and the second memory cells adjacent to each other in the column direction; or the second end faces the second end of corresponding one of the first memory cells and the second memory cells adjacent to each other in the column direction, and the part of the region of the third transistor included in each of the first memory cells may be placed on a boundary between the first memory cells and the second memory cells on the second end.

Further, the first transistor, the second transistor, and the third transistor, each of which is included in the first memory cells and the second memory cells placed in each row, may be placed alongside in the row direction, the first inverter and the second inverter included in the first memory cells and the second memory cells placed in each row may be placed alongside in the row direction, the gates of the first transistor, the second transistor, and the third transistor included in the first memory cells and second memory cells placed in each row, may be formed of a common polysilicon line, the first terminals of the first transistors included in the first memory cells and the second memory cells adjacent to each other at the second ends may be formed of a first diffusion region placed on the boundary on the second ends, and the first terminal of the second transistors may be formed of a second diffusion region placed on the boundary on the second ends, the first diffusion region and the second diffusion region being shared by corresponding first terminals, the source of the ROM cell may be formed of a third diffusion region shared by the GNDs of the first inverter and the second inverter placed adjacent to each other in the row direction, and a fourth diffusion region that is the drain of the third transistor may be placed alongside with the first diffusion region and the second diffusion region in the row direction on the boundary between on the second ends.

According to the above configuration, it is possible to place the ROM cell on the boundary region, which is a free space of the SRAM cell, used in common by the first memory cell and the second memory cell. Accordingly, with the combination memory device according to the present invention, it is possible to place the SRAM cell and the ROM cell on the area equivalent to the area of the SRAM cell.

Further, each of the first memory cells and each of the second memory cells may be placed alternately in the row direction and in the column direction.

According to the above configuration, control can be facilitated because the first memory cells and the second memory cells are arranged regularly. More specifically, since the first memory cells and the second memory cells are arranged alternately in each row, it is possible to use the third bit lines for two columns as a single address. Thus, it is possible to reduce the area of peripheral circuits (row selection circuit) of the combination memory device according to the present invention.

Further, the third bit line may include fourth bit lines, and the ROM cell may output data of plural bits via the fourth bit lines, by outputting data, to each of the fourth bit lines, determined depending on whether or not the contact is included, the contact connecting the drain of the third transistor to each of the fourth bit lines.

According to the above configuration, it is possible for a single ROM cell to store data of plural bits. Here, in the combination memory device including the SRAM and the ROM, the area of the memory cell is larger than the area of the memory cell of a memory device including the ROM only. Therefore, it is not necessary to increase the area of the memory cell even when the fourth bit lines are included in the single ROM cell. As described above, it is possible to increase the capacity of the ROM without increasing the area.

Further, the ROM cell may output, to the fourth bit lines, data of plural bits which is determined depending on: whether or not the contact is included; and to which one of the fourth bit lines the contact connects the drain of the third transistor, the ROM cell including only one of the contact at most.

According to the above configuration, only a single fourth bit line at most is connected to the third transistor included in the ROM cell. Accordingly, it is possible to reduce the load capacity of the third transistor compared to the case where plural fourth bit lines are connected to the third transistor. Thus, it is possible to improve the speed of ROM reading of the combination memory device according to the present invention.

Further, each of the first memory cells and each of the second memory cells may be placed alternately in the row direction and in the column direction, in which the fourth bit lines are three bit lines, and the ROM cell may output, to the fourth bit lines that are the three bit lines, 3-bit data in four patterns determined depending on: whether or not the contact is included; and to which one of the three fourth bit lines the contact connects the drain of the third transistor, the ROM cell including only one of the contact at most.

Further, the first bit line and the second bit line may be formed of a first metal wiring layer, and the fourth bit lines may be formed of a second metal wiring layer that is different from the first metal wiring layer.

According to the above configuration, in the combination memory device of the present invention, the first and the second bit lines for the SRAM and the fourth bit lines for the ROM are formed on different metal wiring layers. With this, it is possible for the combination memory device according to the present invention to prevent an increase in the area of the memory cell region caused by providing the fourth bit lines. Further, it is possible for the combination memory device according to the present invention to prevent a malfunction resulting from an interaction of the first and the second bit lines for the SRAM and the forth bit lines for the ROM.

Further, the combination memory device may include: sense amplifiers provided for each of the fourth bit lines, each of the sense amplifiers amplifying data of a corresponding one of the fourth bit lines; and an encoding circuit which encodes the data of plural bits so that the number of bits decreases, the data having been amplified by the sense amplifiers.

According to the above configuration, the combination memory device of the present invention can output, to the outside, data of plural bits stored in the ROM cell after reducing the number of bits of the data. Thus, it is possible to reduce the number of data output terminals of the combination memory device according to the present invention.

Further, the combination memory device may include: a RAM column selection circuit which selects, from among sets of the first bit lines and the second bit lines, a set corresponding to an address inputted from outside; a RAM reading circuit which amplifies a signal of the set of the first bit lines and the second bit lines selected by the RAM column selection circuit; a RAM writing circuit which provides the set of the first bit lines and the second bit lines that has been selected by the RAM column selection circuit with a signal corresponding to writing data; a ROM column selection circuit which selects, from among the third bit lines, the third bit line corresponding to the address; and a ROM reading circuit which amplifies a signal of the third bit line selected by the ROM column selection circuit, wherein the RAM column selection circuit may select none of the sets of the first bit lines and the second bit lines during a time when one of the third bit lines is selected by the ROM column selection circuit, and the ROM column selection circuit may select none of the third bit lines during a time when one of the sets of the first bit lines and the second bit lines is selected by said RAM column selection circuit.

According to the above configuration, the combination memory device of the present invention causes: all of the third bit lines for the ROM to be unselected during the SRAM operation; and all of the first and the second bit lines to be unselected during the ROM operation. With this, the combination memory device according to the present invention can reduce unnecessary current consumption which results from charging or discharging the third bit line during the SRAM operation. Likewise, the combination memory device according to the present invention can reduce unnecessary current consumption which results from charging or discharging the first and the second bit lines during the ROM operation.

Further, the combination memory device may further include: a timing circuit which activates the word line at a time of: data writing onto the SRAM cell; data reading from the SRAM cell; and data reading from the ROM cell, for different amount times.

According to the above configuration, the combination memory device of the present invention can activate the word line, during each of the data writing operation on the SRAM, the data reading operation from the SRAM, the data reading operation from the ROM, for only the minimum period necessary for each of the operations. Accordingly, with the combination memory device of the present invention, it is possible to reduce unnecessary current consumption which results from making the period for activating the word line the same for each of the operations.

Further the ROM cell may output, to the third bit line, data determined depending on: (i) whether or not a third transistor having a source to which a GND is connected, a gate to which the word line is connected, and the third bit line to which a drain is connected, is included, or (ii) whether or not the third transistor and a diffusion region are included, the third transistor having a gate to which the word line is connected and the third bit line to which a drain is connected, the diffusion region connecting the GND to the source of the third transistor.

Further, a semiconductor device comprising according to the present invention includes a flash memory; and the combination memory device, wherein the ROM included in the combination memory device stores a loader program for writing data onto the flash memory According to the above configuration, with the semiconductor device of the present invention, it is not necessary to download a loader program from an external on-board flash serial writer and the like, by storing the loader program in advance in the ROM of the combination memory device. Accordingly, with the semiconductor device of the present invention, it is possible to reduce the amount of time taken for rewriting data for a flash memory.

Further, since it is not necessary to store the loader program in the SRAM with the semiconductor device of the present invention, it is sufficient for the semiconductor device of the present invention to mount an SRAM with a minimum necessary capacity. Accordingly, it is possible to reduce the chip size with the semiconductor device of the present invention.

According to the above, the present invention can provide a combination memory device and a semiconductor device which can reduce the area of a memory cell region

FURTHER INFORMATION ABOUT TECHNICAL BACKGROUND TO THIS APPLICATION

The disclosure of Japanese Patent Application No. 2008-167606 filed on Jun. 26, 2008 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENTS

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Embodiments of a combination memory device according to the present invention will be described in detail below with reference to the drawings.

First Embodiment

A combination memory device according to a first embodiment of the present invention includes: a first memory cell having a ROM cell and an SRAM cell; and a second memory cell having only an SRAM cell. The first and second memory cells are arranged in a zigzag pattern. Further, in the combination memory device according to the first embodiment of the present invention, the ROM cell of the first memory cell is placed in a free space positioned on the boundary between the first memory cell and the second memory cell. The above structure enables the combination memory device according to the first embodiment of the present invention to implement a ROM function in addition to an SRAM function, while maintaining the same area for memory cells as in the case where only the SRAM is included.

First, a configuration of a combination memory device 100 according to the first embodiment of the present invention will be described.

Figure 1:
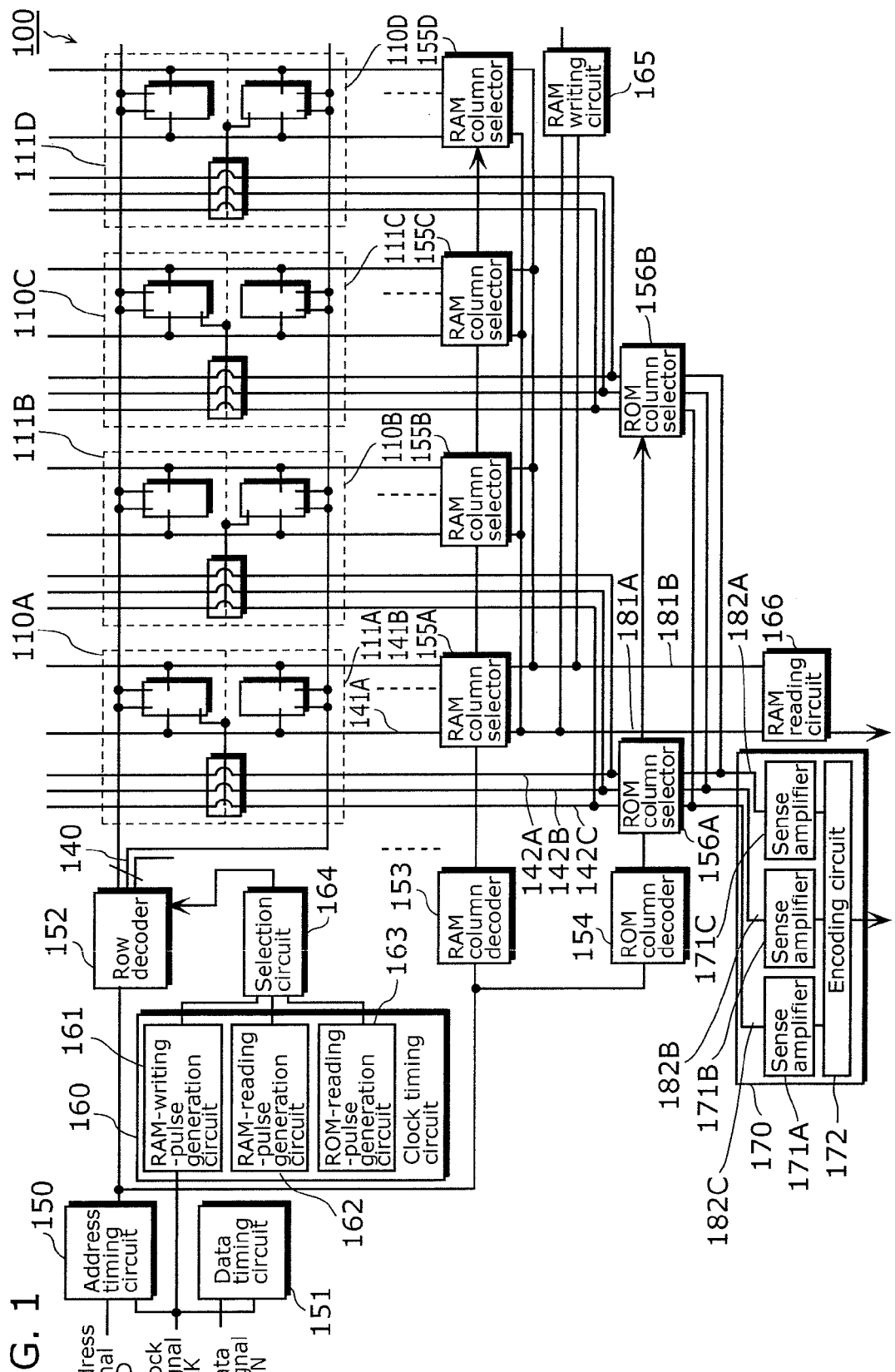
FIG. 1 is a block diagram which shows a configuration of a combination memory device according to a first embodiment of the present invention.

FIG. 1 is a block diagram which shows the configuration of the combination memory device 100 according to the first embodiment of the present invention.

The combination memory device 100 shown in FIG. 1 includes an SRAM and a ROM (MROM: mask Rom). More specifically, the combination memory device 100 functions selectively as the SRAM or the ROM according to a control signal from outside. Further, the SRAM and the ROM which are included in the combination memory device 100 have the same capacity and share an address.

Further, the combination memory device 100 receives an input of an address signal ADD, a clock signal CLK, and a data signal DIN from outside. The combination memory device 100 performs an operation of writing data on the SRAM (hereinafter referred to as RAM writing), an operation of reading data from the SRAM (hereinafter referred to as RAM reading), and an operation of reading data from the ROM (hereinafter referred to as ROM reading), with the timing based on the clock signal CLK. It is to be noted that switching between the RAM writing, the RAM reading, and the ROM reading is controlled by a control signal (not shown) inputted from outside.

More specifically, the combination memory device 100, at the time of the RAM writing, writes the data signal DIN on the SRAM cell of the address specified by the address signal ADD. Further, the combination memory device 100, at the time of the RAM reading, reads data stored in the SRAM cell of the address specified by the address signal ADD, and outputs the data that has been read to the outside. Further, the combination memory device 100, at the time of the ROM reading, reads data stored in the ROM of the address specified by the address signal ADD.

The combination memory device 100 includes: plural first memory cells 110A to 110D; plural second memory cells 111A to 111D; plural word lines 140; plural RAM bit lines 141A and 141B; plural ROM bit lines 142A, 142B, and 142C; an address timing circuit 150; a data timing circuit 151; a row decoder 152; a RAM column decoder 153; a ROM column decoder 154; plural RAM column selectors 155A to 155D; plural ROM column selectors 156A and 156B; a clock timing circuit 160; a selection circuit 164; a RAM writing circuit 165; a RAM reading circuit 166; a ROM reading circuit 170; common RAM bit lines 181A and 181B, and common ROM bit lines 182A to 182C.

It is to be noted that, unless it is necessary to be distinguished individually, the plural first memory cells 110A to 110D, the plural second memory cells 111A to 111D, the RAM bit lines 141A and 141B, the ROM bit lines 142A to 142C, the plural RAM column selectors 155A to 155D, the plural ROM column selectors 156A and 156B, the common RAM bit lines 181A and 181B, and common ROM bit lines 182A to 182C are described collectively as the first memory cell 110, the second memory cell 111, the RAM bit line 141, the ROM bit line 142, the RAM column selector 155, the ROM column selector 156, the common RAM bit line 181, and the common ROM bit line 182, respectively.

It is to be further noted that, the first memory cell 110 and the second memory cell 111 are described here as in a 2-row by 4-column cell array for simplifying the description. However, the number of the first memory cell 110 and the second memory cell 111 are not limit to this. Likewise, although FIG. 1 shows a configuration by which 1-bit data is written and read, data of plural bits may be written and read concurrently.

The first memory cell 110 and the second memory cell 111 are arranged in a matrix. Further, the first memory cell 110 includes the SRAM cell and the ROM cell, and the second memory cell 111 includes only the SRAM cell.

Further, the first memory cell 110 and the second memory cell 111 are arranged in a zigzag pattern. Thus, the plural first memory cells 110 and the plural second memory cells 111 are arranged alternately in a row direction and arranged alternately in a column direction. In other words, in the row and column direction, all memory cells adjacent to the first memory cells 110 are the second memory cells 111, and all memory cells adjacent to the second memory cells 111 are the first memory cells 110.

The plural word lines 140 are provided one by one for each row, and used for selecting the first memory cell 110 and the second memory cell 111 placed in a corresponding row.

The plural RAM bit lines 141A and 141B are provided one by one for each column, and used for reading data from the SRAM cell and for writing data on the SRAM cell which are placed in a corresponding column.

The plural ROM bit lines 142A to 142C are provided one by one for each column, and used for reading data from the ROM cell placed in a corresponding column.

The configuration of the first memory cell 110 and the second memory cell will be described in detail below.

Figure 2:
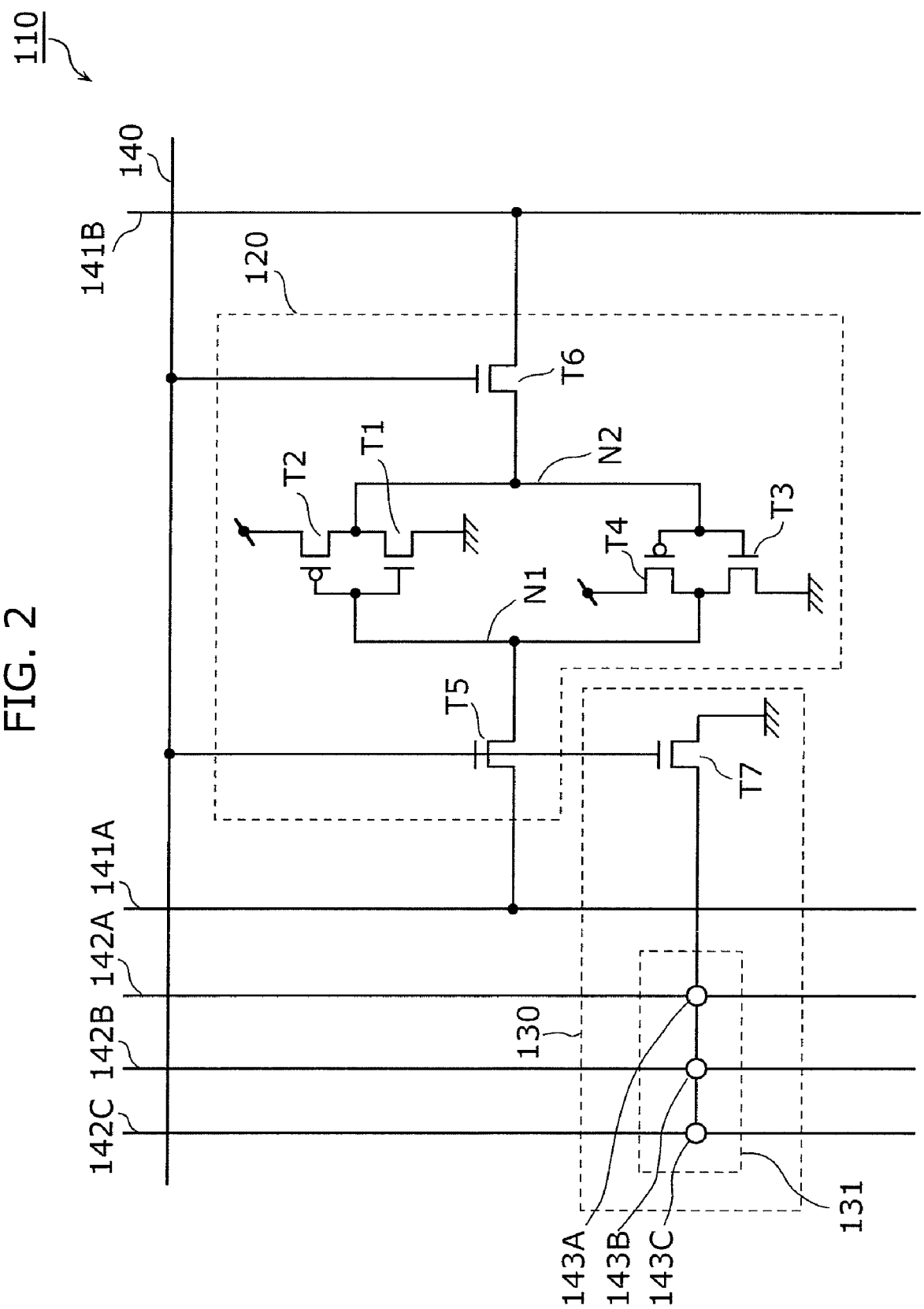
FIG. 2 is a circuit diagram which shows a configuration of a first memory cell according to the first embodiment of the present invention.

FIG. 2 is a circuit diagram which shows a configuration of the first memory cell 110. The first memory cell 110 shown in FIG. 2 includes the SRAM cell 120 and the ROM cell 130.

The SRAM cell 120 is a storage unit which holds 1-bit data and can rewrite data held therein. The SRAM cell 120 includes transistors T1 to T6. Here, the transistors T1, T3, T5, and T6 are n-type MOS transistors and the transistors T2 and T4 are p-type MOS transistors.

The transistor T1 includes: a gate connected to a node N1; a drain connected to a node N2; and a source connected to a GND (ground potential). The transistor T2 includes: a gate connected to a node N1; a drain connected to a node N2; and a source connected to a VDD (power potential). More specifically, the transistor T1 and the transistor T2 are CMOS inverters in which an input terminal is connected to the node N2 and an output terminal is connected to the node N1.

The transistor T3 includes: a gate connected to the node N2; a drain connected to the node N1; and a source connected to the GND. The transistor T4 includes: a gate connected to the node N2; a drain connected to the node N1; and a source connected to a VDD (power supply potential). More specifically, the transistor T3 and the transistor T4 are CMOS inverters in which an input terminal is connected to the node N1 and an output terminal is connected to the node N2.

The transistor T5 includes: a gate connected to the word line 140; one of a source or a drain connected to the node N1; and the other one of the source or the drain connected to the RAM bit line 141A.

The transistor T6 includes: a gate connected to the word line 140; one of a source or a drain connected to the node N2; and the other one of the source or the drain connected to the RAM bit line 141B.

The ROM cell 130 is a read-only (non-rewritable) storage unit which stores 3-bit data. The ROM cell 130 includes a transistor T7 and a contact unit 131.

The transistor T7 is an n-type MOS transistor and includes a gate connected to the word line 140; a source connected to the GND; and a drain connected to the contact unit 131.

The contact unit 131 includes either one of or none of contacts 143A to 143C according to data stored in the ROM cell 130. It is to be noted that, the contacts 143A to 143C are described collectively as the contact 143, unless it is necessary to be distinguished individually. Further, it is determined in the manufacturing stage whether or not the contact 143 is included.

Each of the contacts 143A to 143C connects the drain of the transistor T7 to a corresponding one of the ROM bit lines 142A to 142C.

As described above, the ROM cell 130 outputs, to each of the ROM bit lines 142, data determined based on whether or not the contact 143 connecting the drain of the transistor T7 to corresponding one of the ROM bit lines 142 is included, so that plural-bit data is outputted via the plural ROM bit lines 142.

Figure 3:
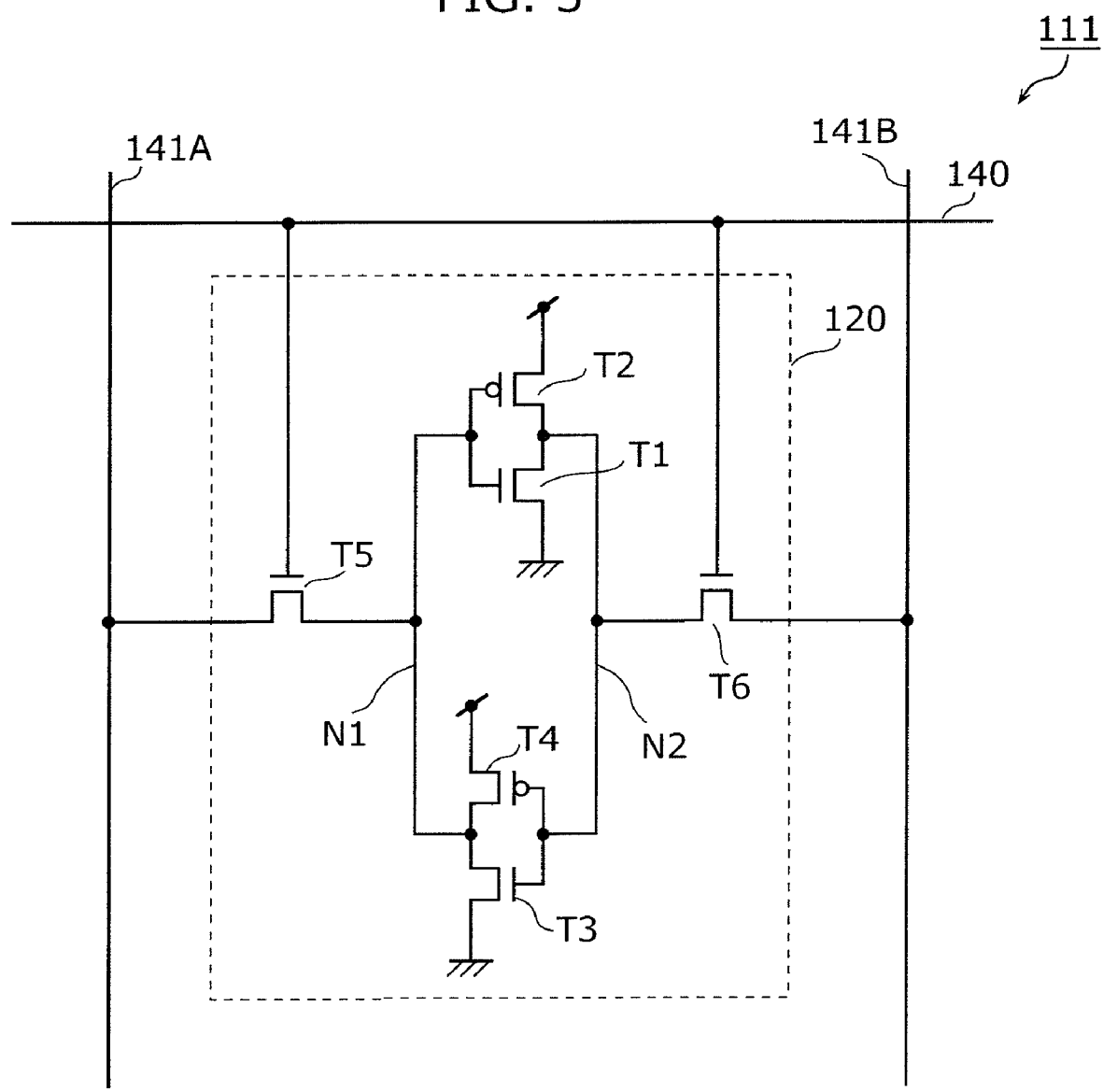
FIG. 3 is a circuit diagram which shows a configuration of a second memory cell according to the first embodiment of the present invention.

FIG. 3 is a circuit diagram which shows a configuration of the second memory cell 111. The second memory cell 111 as shown in FIG. 1 includes only the SRAM cell 120 and does not include the ROM cell 130. It is to be noted that the SRAM cell 120 has the same configuration as in FIG. 2 and the descriptions for that is omitted.

Discretions will be given with reference again to FIG. 1.

The address timing circuit 150 latches an address signal ADD using a clock signal CLK. More specifically, the address timing circuit 150 receives the address signal ADD with a timing of change of the clock signal CLK and holds the received data. The data timing circuit 151 latches a data signal DIN using a clock signal CLK.

The clock timing circuit 160 generates a pulse signal indicating a timing of activating the word line 140 based on the timing of change of the clock signal CLK. Further, the clock timing circuit 160 generates a pulse signal that activates the word line 140 according to an operation mode (RAM writing, RAM reading, and ROM reading) for a different period of time.

More specifically, the clock timing circuit 160 includes: a RAM-writing-pulse generation circuit 161 that generates a pulse signal used for RAM writing; a RAM-reading-pulse generation circuit 162 that generates a pulse signal used for RAM writing; and a ROM-reading-pulse generation circuit 163 that generates a pulse signal used for ROM reading.

The selection circuit 164 selects: a pulse signal generated by the RAM-writing-pulse generation circuit 161 at the time of RAM writing; a pulse signal generated by the RAM-reading-pulse generation circuit 162 at the time of RAM writing; and a pulse signal generated by the ROM-reading-pulse generation circuit 163 at the time of ROM reading. Further, the selection circuit 164 outputs the selected pulse signal to the row decoder 152.

The row decoder 152 selects one of the plural word lines 140 by decoding higher-order bits of the address signal ADD held by the address timing circuit 150. Further, the row decoder 152 activates the selected word line 140 with a timing of the pulse signal outputted from the selection circuit 164.

Figure 4:
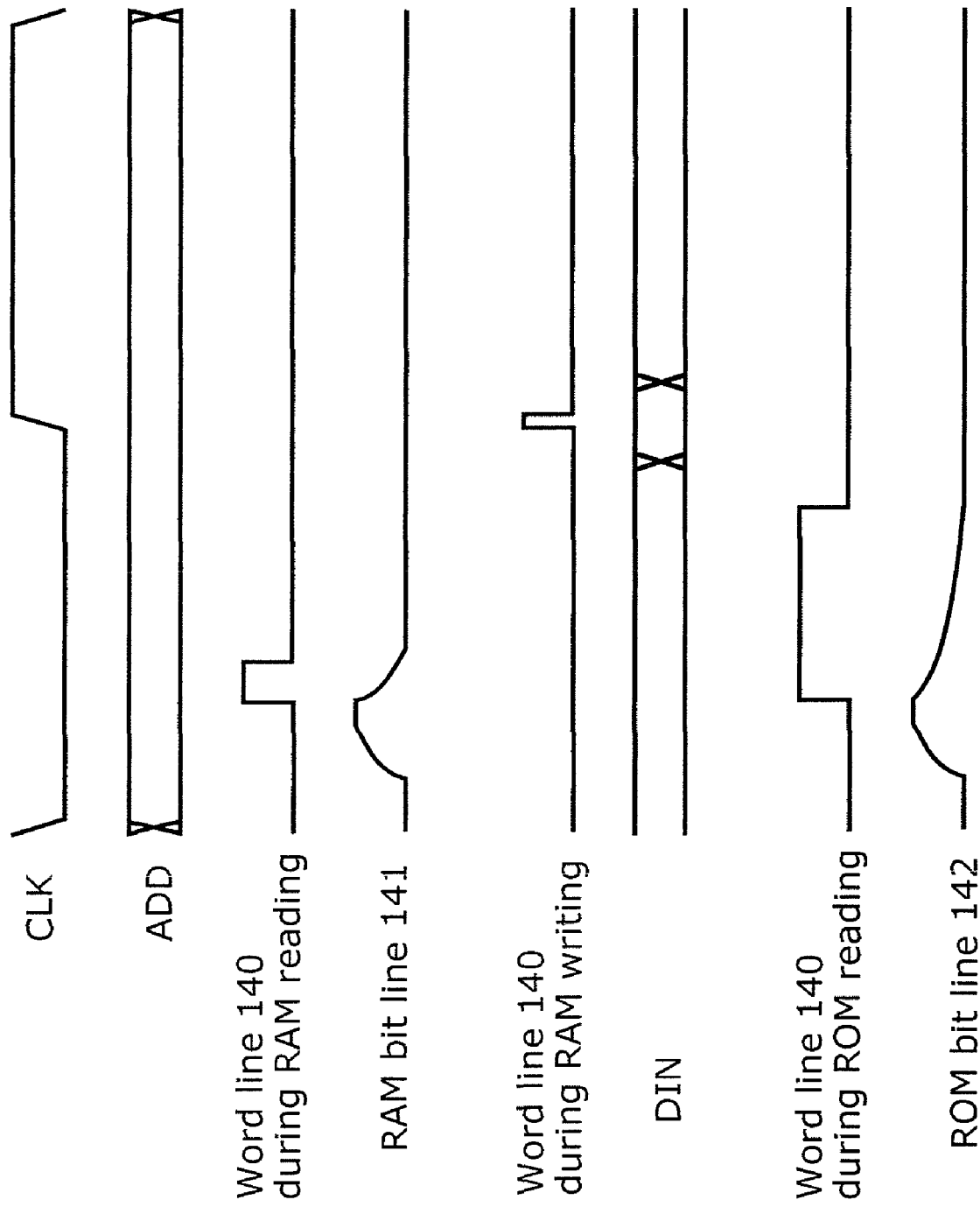
FIG. 4 is a diagram which shows a state of: a word line; a RAM bit line; and a ROM bit line in each operation mode according to the first embodiment of the present invention.

FIG. 4 is a diagram which shows a status of the word line 140, the RAM bit line 141, and the ROM bit line 142 in each of the operation modes. A shown in FIG. 4, the word line 140 is activated for a different period of time in each of the operation modes.

Here, the word line 140 is commonly used by the SRAM cell 120 and the ROM cell 130 of the first memory cell 110. Therefore, the SRAM cell 120 is also activated concurrently at the time of ROM reading. Likewise, the ROM cell 130 is also activated concurrently at the time of RAM reading and RAM writing. This causes unnecessary current consumption to occur in each of the modes.

Further, a duration in which the word line 140 necessary for RAM reading is activated (hereinafter referred to as word line duration) is generally different from the word line duration necessary for ROM reading. This is because there is a difference between load capacity of the RAM bit line 141 and the ROM bit line 142, and between drive capability of the SRAM cell 120 and the ROM cell 130. The load capacity and the drive capability are determined depending on the characteristic of a memory cell and the layout of memory cells arranged in arrays. Further, the characteristic and the layout of memory cells are determined according to a combined factor of a rule for mask layout size (hereinafter referred to as design rule) in a semiconductor manufacturing process and a characteristic of a transistor.

As described above, it is highly difficult to make the word line duration necessary for RAM reading same as the word line duration necessary for ROM reading.

Thus, in the case where the same word line duration is used for RAM reading and ROM reading, it is necessary to use the longer word line duration between word line durations for RAM reading and ROM reading. For example, the word line duration necessary for ROM reading is longer than the word line duration for RAM reading as shown in FIG. 4. Thus, the word line duration of the length that is practically unnecessary is used, causing wasteful current consumption to occur.

Further, it is possible to shorten the word line duration for ROM reading by, for example, increasing the drive capability of the transistor T7 of the ROM cell 130, that is, by increasing a gate width of the transistor T7. However, increase in the gate width of the transistor T7 is not preferable because it directly means increase in the cell size of the first memory cell 110 (the layout of the first memory cell 110 will be described in detail later).

On the other hand, the combination memory device 100 according to the first embodiment of the present invention generates, in the clock timing circuit 160, a pulse signal of a word line duration suitable to each of the operation modes. This enables the combination memory device 100 to use the minimum word line duration necessary for each of the operation modes, so that current consumption can be reduced.

Further, the word line duration for RAM writing is shorter than the word line duration for RAM reading in FIG. 4. This is because the writing operation is performed by a driving buffer which has high drive capability and is included in the RAM writing circuit 165, so that it requires a less amount of time for charging and discharging the RAM bit line 141.

Plural RAM column selectors 155 are provided for each column. Each of the RAM column selectors 155 is a switch that connects or disconnects a set of RAM bit lines 141A and 141B for a corresponding column to or from the common RAM bit lines 181A and 181B.

The RAM column decoder 153 causes one of the plural RAM column selectors 155 to be connected and causes the other RAM column selectors 155 to be disconnected, by decoding plural lower bits of the address signal ADD held by the address timing circuit 150. In other words, the RAM column decoder 153 selects a set of RAM bit lines 141A and 141B corresponding to the address signal ADD, and connects the selected set of RAM bit lines 141A and 141B to the common RAM bit lines 181A and 181B.

Further, the RAM column decoder 153 causes all of the RAM column selectors 155 to be disconnected at the time of ROM reading.

The RAM writing circuit 165 outputs a signal corresponding to the data signal DIN held by the data timing circuit 151 to the common RAM bit line 181 at the time of RAM writing.

The RAM reading circuit 166 amplifies a signal of the common RAM bit line 181 at the time of RAM reading.

Further, each of the ROM bit lines 142A to 142C is short-circuited for every two columns. More specifically, a ROM bit line 142 in a column is connected to a ROM bit line 142 in one of the neighboring columns.

Each of the plural ROM column selectors 156 is provided for every two columns. The ROM column selector 156 is a switch that connects or disconnects the ROM bit line 142 for corresponding two columns to or from the common ROM bit line 182.

The ROM column decoder 154 causes one of the plural ROM column selectors 156 to be connected and causes the other ROM column selectors 156 to be disconnected, by decoding plural lower bits (strictly speaking, plural lower bits excepting the least significant bit) of the address signal ADD held by the address timing circuit 150. In other words, the ROM column decoder 154 selects a set of ROM bit lines 142A to 142C corresponding to the address signal ADD, and connects the selected set of ROM bit lines 142A and 141B to the common ROM bit lines 181A to 181C.

Further, the ROM column decoder 154 causes all of the ROM column selectors 156 to be disconnected at the time of RAM reading and RAM writing.

As described above, the combination memory device 100 does not select the RAM bit line 141 at the time of a ROM operation (ROM reading). This makes it possible to prevent occurrence of unnecessary current consumption caused by pre-charging or discharging the RAM bit line 141 at the time of the ROM operation.

Likewise, the combination memory device 100 does not select the ROM bit line 142 at the time of a RAM operation (RAM reading and RAM writing). This makes it possible to prevent occurrence of unnecessary current consumption caused by pre-charging or discharging the ROM bit line 142 at the time of the RAM operation The ROM reading circuit 170 includes three sense amplifiers 171A to 171C and an encoding circuit 172.

Each of the sense amplifiers 171A to 171C amplifies a signal of a corresponding one of common ROM bit lines 182A to 182C.

The encoding circuit 172 encodes 3-bit data amplified by the sense amplifiers 171A to 171C into 1-bit data by using a least significant address NA0. Here, the least significant address NA0 is a signal having an inverted logic of a signal of the least significant bit of the address signal ADD held by the address timing circuit 150.

Figures 5, 6:
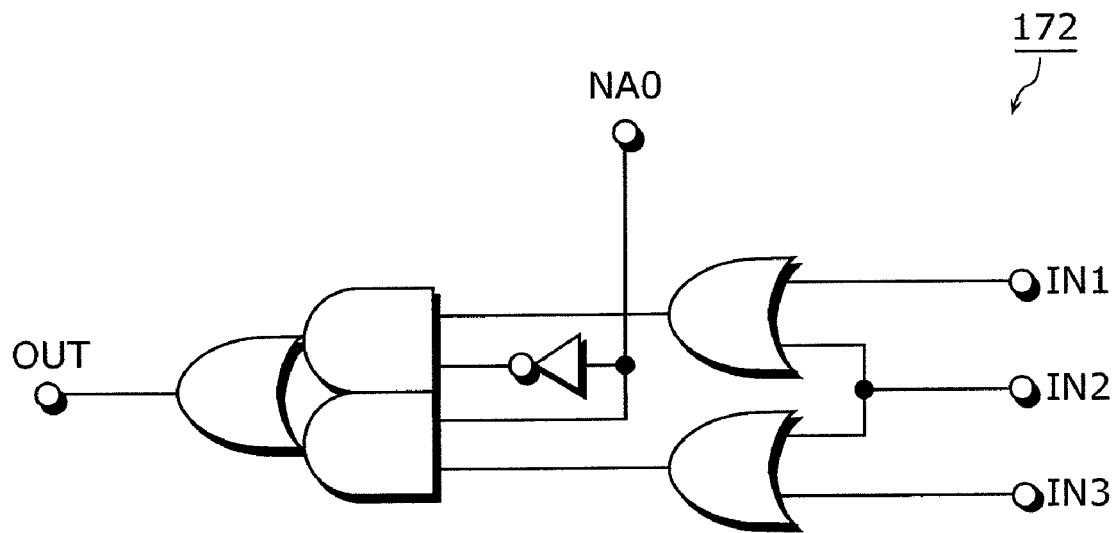
FIG. 5 is a circuit diagram which shows a configuration of an encode circuit according to the first embodiment of the present invention.
FIG. 6 is a truth table which indicates an input-output relation of the encode circuit according to the first embodiment of the present invention.

FIG. 5 is a circuit diagram which shows a configuration of the encoding circuit 172. FIG. 6 is a table of truth value indicating a relationship between input and output of the encoding circuit 172.

The encoding circuit 172 includes input terminals IN1 to IN3 each of which receives a signal amplified by corresponding one of the sense amplifiers 171A to 171C. More specifically, signals inputted into input terminals IN1 to IN3 correspond to signals of the ROM bit lines 142A to 142C, respectively.

Further, as shown in FIG. 6, the encoding circuit 172 outputs, to an output terminal OUT, a signal corresponding to the signal of the ROM bit lines 142A to 142C and the least significant address NA0.

Next, an operation of the combination memory device 100 will be described.

A RAM writing operation will be described below.

First, the address timing circuit 150 and the data timing circuit 151 latch the address signal ADD and the data signal DIN, respectively, with a timing of change of the clock signal CLK.

Next, the RAM column decoder 153 causes one of the plural RAM column selectors 155 to be connected based on the plural lower bits of the address signal ADD held by the address timing circuit 150.

Next, the RAM writing circuit 165 drives the common RAM bit lines 181A and 181B to a signal corresponding to the data signal DIN held by the data timing circuit 151. This causes the RAM bit lines 141A and 141B of the column selected by the RAM column decoder 153 to be driven to a voltage corresponding to the data signal.

Next, the row decoder 152 selects one of the word lines 140 based on the higher-order bits of the address signal ADD held by the address timing circuit 150, and drives the selected word line 140 with a timing based on the pulse signal generated by the RAM-writing-pulse generation circuit 161.

According to the above described operations, the data signal DIN is written on the SRAM cell 120 of the address specified by the address signal ADD.

Next, a RAM reading operation will be described.

First, the address timing circuit 150 latches the address signal ADD with a timing of a change of the clock signal CLK.

Next, the RAM column decoder 153 causes one of the plural RAM column selectors 155 to be connected based on the plural lower bits of the address signal ADD held by the address timing circuit 150.

Next, the RAM reading circuit 166 precharges: the common RAM bit lines 181A and 181B; and the RAM bit lines 141A and 141B in the column selected by the RAM column decoder 153. Here, to precharge means to charge a signal line to a high potential such as the VDD.

Next, the row decoder 152 selects one of the word lines 140 based on the higher-order bits of the address signal ADD held by the address timing circuit 150, and drives the selected word line 140 with a timing based on the pulse signal generated by the RAM-reading-pulse generation circuit 162.

This causes one of the RAM bit lines 141A and 141B to be discharged according to the data held by the SRAM cell 120 connected to the word line 140 which has been driven. Accordingly, a potential of the common RAM bit lines 181A and 181B connected to the RAM bit lines 141A and 141B changes. Here, to discharge means to lower the potential of the signal line to a low voltage by relieving a charge of the precharged signal line.

This causes the RAM reading circuit 166 to amplify a potential change in the common RAM bit lines 181A and 182B, thereby outputting read data corresponding to the data held by the selected SRAM cell 120. Here, the read data that has been amplified by the RAM reading circuit 166 is outputted to the outside of the combination memory device 100 via an outputting circuit (not illustrated).

According to the above described operation, the data held by the SRAM cell 120 of the address specified by the address signal ADD is outputted.

Next, a ROM reading operation will be described.

First, the address timing circuit 150 latches the address signal ADD with a timing of a change of the clock signal CLK.

Next, the ROM column decoder 154 causes one of plural ROM column selectors 156 to be connected based on the plural lower bits excepting the least significant bit of the address signal ADD held by the address timing circuit 150. This causes the ROM bit lines 142 in two columns connected to the selected ROM column selector 156 to be connected to the common ROM bit line 182.

Next, the ROM reading circuit 170 precharges the common ROM bit line 182 and the ROM bit lines 142 in two columns selected by the ROM column decoder 154 to the VDD.

Next, the row decoder 152 selects one of the word lines 140 based on the higher-order bits of the address signal ADD held by the address timing circuit 150, and drives the selected word line 140 with a timing based on the pulse signal generated by the ROM-reading-pulse generation circuit 163.

This causes the potential of the ROM bit line 142 according to the data set in the ROM cell 130 connect to the driven word line 140. Accordingly, the potential of the common ROM bit line 182 connected to the ROM bit line 142 changes.

Next, each of the sense amplifiers 171A to 171C amplifies a potential change of corresponding one of the common ROM bit lines 182A to 182C.

Here, the ROM cell 130 outputs data determined based on whether or not the contact unit 131 includes the contacts 143A to 143C. More specifically, the ROM cell 130 outputs, to the ROM bit line 142, 3-bit data in one of four patterns which are determined depending on: whether or not one of the contacts 143A to 143C is included; and which one of the contacts 143A to 143C is included.

The first pattern is the case where the contact unit 131 includes none of the contacts 143A to 143. In this case, the precharged ROM bit lines 142A to 142C are not discharged. Accordingly, the sense amplifiers 171A to 171C output data "1, 1, 1".

The second pattern is the case where the contact unit 131 includes only the contact 143A. In this case, only the ROM bit line 142A is discharged among the precharged ROM bit lines 142A to 142C, and the ROM bit lines 142B and 142C are not discharged. Accordingly, the sense amplifiers 171A to 171C output data "1, 1, 0".

The third pattern is the case where the contact unit 131 includes only the contact 143B. In this case, only the ROM bit line 142B is discharged and the ROM bit lines 142A and 142C are not discharged. Accordingly, the sense amplifiers 171A to 171C output data "1, 0, 1".

The forth pattern is the case where the contact unit 131 includes only the contact 143C. In this case, only the ROM bit line 142C is discharged and the ROM bit lines 142A and 142B are not discharged. Accordingly, the sense amplifiers 171A to 171C output data "0, 1, 1".

Here, the contact unit 131 includes only one of or none of the contacts 143A to 143C. This causes the number of the ROM bit lines 142 discharged by the transistor T7 to be one at most. On the other hand, in the case where the contact unit 131 includes three contacts, the transistor T7 need to discharge three ROM bit lines 142, so that the load capacity of the transistor T7 increases about three times as much as that in the case where the only one contact is included.

More specifically, the contact unit 131 includes only one of the contacts 143 at most, so that the word line duration necessary for ROM reading can be shortened. Therefore, the combination memory device 100 can speed up the ROM reading.

On the other hand, the 3-bit signal amplified by the sense amplifiers 171A to 171C is inputted into the encoding circuit 172. The encoding circuit 172 converts the inputted 3-bit signal into 1-bit read signal by using the least significant address NA0.

It is assumed, for example, that the contact unit 131 of the first memory cell 110A includes only the contact 143A, an address of the first memory cell 110A is selected, and the least significant address NA0 is "1". In this case, data "1, 1, 0" stored in the ROM cell 130 of the first memory cell 110A is outputted from the sense amplifiers 171A to 171C. In this case, since the least significant address NA0 is "1", the encoding circuit 172 outputs "0" as read data as shown in FIG. 6.

On the other hand, It is assumed that the second memory cell 111B is located in the column adjacent to the first memory cell 110A is selected, and the least significant address NA0 is "0". In this case, since the ROM column selector 156A corresponding to the column in which the second memory cell 111B is located is selected just as in the case where the first memory cell 110A is selected, data "1, 1, 0" stored in the ROM cell 130 of the first memory cell 110A is outputted from the sense amplifiers 171A to 171C. In this case, since the least significant address NA0 is "0", the encoding circuit 172 outputs "1" as read data as shown in FIG. 6.

As described above, the combination memory device 100 includes one ROM cell 130 for two addresses, and data in four patterns which corresponds to 2-bit data is stored in each of the ROM cells 130. Further, one ROM column selector 156 is formed for the ROM bit lines of two columns, so that the combination memory device 100 can function in a similar manner, in appearance, as in the case where 1-bit data is stored in each address, by decoding using the least significant address NA0 in the encoding circuit 172.

Further, by connecting the ROM bit line 142 in an adjacent column, it is possible to halve the number of the ROM column selectors 156 compared to the case where the ROM column selector 156 is provided to all of the columns. This makes it possible to reduce the area of the combination memory device 100.

On the other hand, the read data outputted from the encoding circuit 172 is outputted to the outside of the combination memory device 100 via the outputting circuit (not illustrated). It is to be noted that the read data of the SRAM and the read data of the ROM may be outputted to the outside from the same output terminal via the same outputting circuit, or may be outputted to the outside from respective dedicated output terminals.

According to the above described operation, the data held by the ROM cell 130 of the address specified by the address signal ADD is outputted.

Next, a layout placement of the first memory cell 110 and the second memory cell 111 of the combination memory device 100 will be described.

Figure 7:
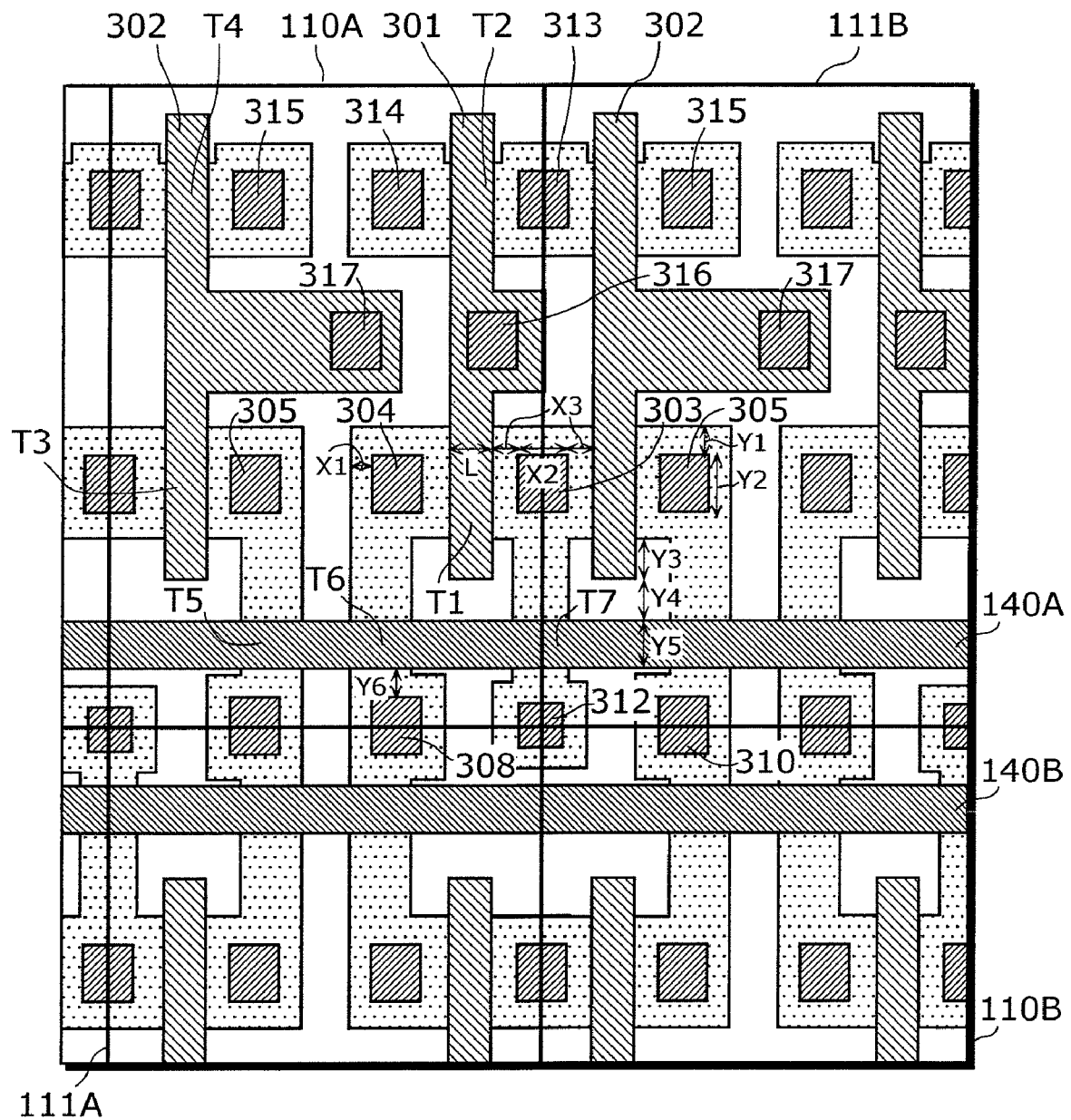
FIG. 7 is a diagram which shows a layout placement of layers up to a polysilicon layer of the combination memory device according to the first embodiment of the present invention.

FIGS. 7 to 13D are diagrams which show layouts of the memory cell region in which the first memory cell 110 and the second memory cell 111 are placed. FIG. 7 is a diagram which shows a layout of the memory cell region up to a polysilicon layer.

As shown in FIG. 7, in the first memory cell 110, elements are placed in a column direction (for example, starting from the top in the first memory cell 110A) in the following order: the transistors T2 and T4, the transistors T1 and T3, and the transistors T5, T6, and T7. Further, in the second memory cell 111, elements are placed in the column direction (for example, starting from the top in the second memory cell 111B) in the following order: the transistors T2 and T4, the transistors T1 and T3, and the transistors T5 and T6.

Further, in rows adjacent to each other, the first memory cell 110 and the second memory cell 111 are placed in a mirror (axisymmetric) arrangement in the column direction.

More specifically, when one end of the first memory cell 110 and the second memory cell in the column direction is a first end, and the other end is a second end, the first memory cell 110 and the second memory cell are arranged so that the first end of the first memory cell 110 and the second memory cell faces a corresponding first end of the second memory cell 111 and the first memory cell 110, and the second end of the first memory cell 110 and the second memory cell 111 faces a corresponding second end of the second memory cell 111 and the first memory cell 110. Further, the first memory cell 110 and the second memory cell 111 placed in each row are arranged so as to be oriented to the same direction in the column direction. For example, in the row including the first memory cell 110A, a top end is the first end and a bottom end is the second end, and in the row adjacent to the row in the column direction and includes the second memory cell 111A, the bottom end is the first end and the top end is the second end. Further, the row in which the top end is the first end and the row in which the bottom end is the first end are placed alternately.

Further, all of the first memory cells 110 and the second memory cells 111 are respectively placed so as to be oriented to the same direction in the row direction. It is to be noted that the first memory cell 110 and the second memory cell 111 may be arranged so as to be oriented to directions different from each other in the row direction. For example, the first memory cell 110 and the second memory cell 111 may be arranged so as to invert an orientation in the row direction for each column or for every several columns.

Further, gates of the transistors T1 and T2 forming a single inverter are formed of a common polysilicon line 301. Likewise, gates of the transistors T3 and T4 forming a single inverter are formed of a common polysilicon line 302. Further, the polysilicon lines 301 and 302 are placed along the column direction. Further, the polysilicon lines 301 and 302 correspond to the node N1 and the node N2, respectively, in FIG. 2.

Further, a source (GND) of the transistor T1 is formed of a diffusion region 303 common to a source of the adjacent transistor T3, and a source (VDD) of the transistor T2 is formed of a diffusion region 313 common to a source of the adjacent transistor T4. More specifically, the diffusion region 303 is a common source region shared between the transistor T1 of the first memory cell 110A and the transistor T3 of the second memory cell 111B adjacent to the first memory cell 110A in the row direction. Further, the diffusion region 313 is a common source region shared between the transistor T2 of the first memory cell 110A and the transistor T4 of the second memory cell 111B adjacent to the first memory cell 110A in the row direction.

Further, the diffusion regions 303 and 313 are placed on the boundary between the first memory cell 110 and the second memory cell 111 which are adjacent to each other in the row direction.

The diffusion region 314 is a drain of the transistor T2 and corresponds to the node N2. The diffusion region 315 is a drain of the transistor T4 and corresponds to the node N1.

The diffusion region 304 is a drain of the transistor T1 and one of a drain or a source of the transistor T6, and corresponds to the node N2. The diffusion region 305 is a drain of the transistor T3 and one of a drain or a source of the transistor T5, and corresponds to the node N1.

Further, the transistors T1, T2, T3 and T4 are placed so that the drains, the gates, and the sources are respectively placed alongside in the row direction.

Further, the transistors T1 and T3 placed in each row are placed alongside in the row direction, and the transistors T2 and T4 are placed alongside in the row direction. In other words, a first inverter including the transistors T1 and T2 and a second inverter including the transistors T3 and T4 are placed alongside in the row direction. More specifically, the diffusion regions 303, 304, and 305 are placed alongside in the row direction. Likewise, the diffusion regions 313, 314, and 315 are placed alongside in the row direction.

The transistors T5, T6, and T7 which are placed in each row are placed alongside in the row direction.

More specifically, the gate of the transistor T5, T6, and T7 are formed of the word line 140A that is the common polysilicon line. Further, the word line 140A is placed along the row direction.

The diffusion region 308 is the other one of the drain or the source of the transistor T6 and connects to the RAM bit line 141B. The diffusion region 310 is the other one of the drain or the source of the transistor T5 and connects to the RAM bit line 141A. The diffusion regions 308 and 310 are placed on the boundary between the first memory cell 110 and the second memory cell 111 which are adjacent to each other in the column direction, and used by the first memory cell 110 and the second memory cell 111 in common.

The diffusion region 312 is the drain of the transistor T7 and connects to the contact unit 131 (the ROM bit line 142). The diffusion region 312 is placed on the boundary between the first memory cell 110 and the second memory cell 111 which are adjacent to each other in the column direction. In other words, the diffusion region 312 are placed in the area of the second memory cell 111 that is placed adjacent to the first memory cell 110.

Further, the diffusion regions 308, 310, and 312 are formed between the word line 140A and the word line 140B of the adjacent second memory cell 111 in the column direction.

Further, the transistors T5, T6, and T7 are placed so that the drains, the gates, and the sources are respectively placed alongside in the column direction.

Further, the diffusion regions 308, 310, and 312 are placed alongside in the row direction.

Further, in the layout, the widths of the polysilicon lines 301, 302, and 140A are set to the minimum size under the design rule.

Further, each of the diffusion regions 303 to 305, 308, 310, and 312 to 315 includes a contact connecting a corresponding diffusion region layer to a first metal wiring layer.

Figure 8:
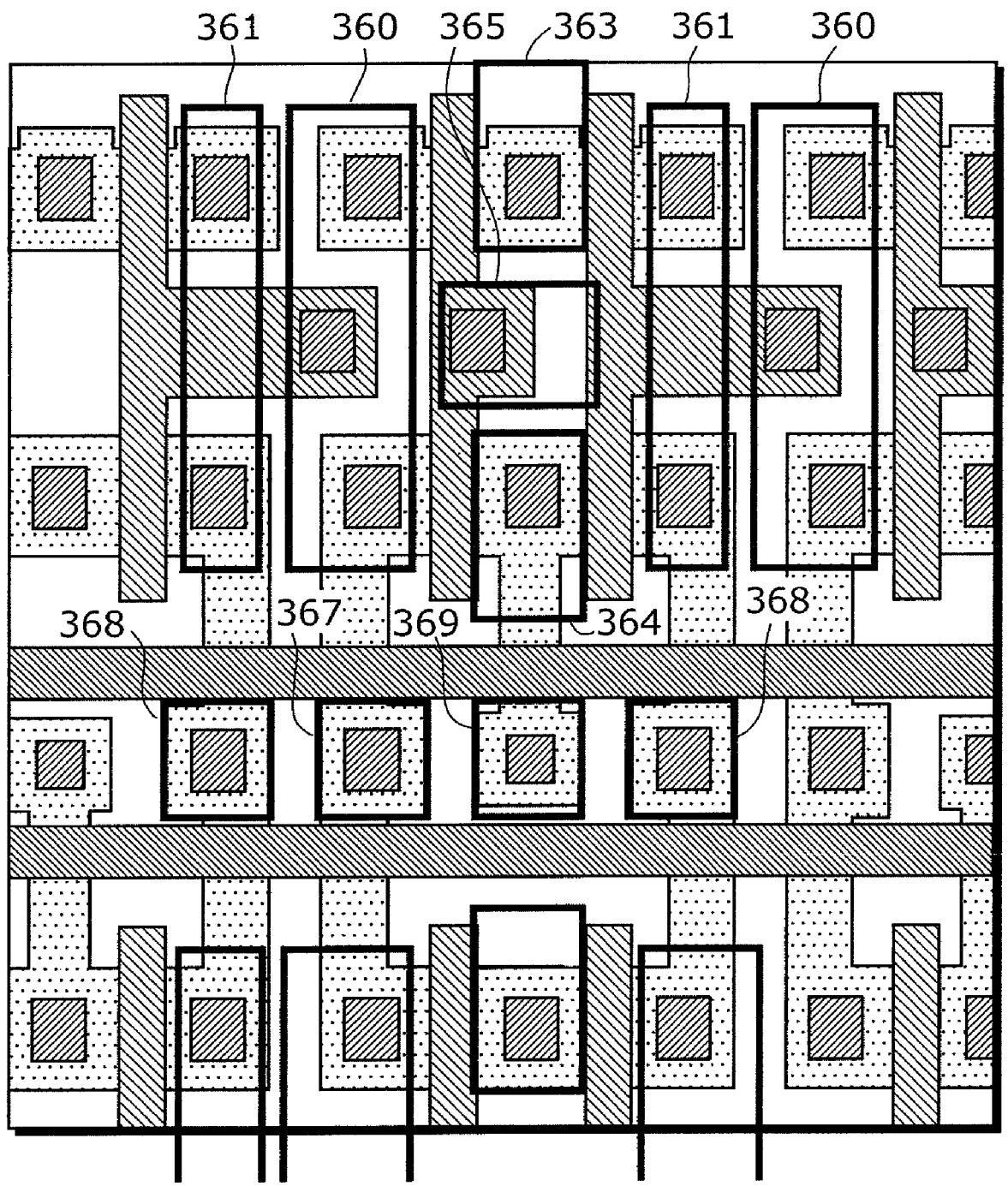
FIG. 8 is a diagram which shows a layout placement of layers up to a first metal wiring layer of the combination memory device according to the first embodiment of the present invention.

FIG. 8 is a diagram which shows a layout of layers up to a first metal wiring layer of a memory cell region of the combination memory device 100.

Wires 360, 361, and 363 to 369 as shown in FIG. 8 are formed by using the first metal wiring layer.

The wire 360 connects the diffusion regions 304, 314, and the polysilicon line 302. The wire 361 connects the diffusion regions 305 and 315.

Each of the wires 363 to 369 connects to a corresponding one of the diffusion regions 313 and 303, the polysilicon line 301, and the diffusion regions 308, 310, and 312.

Figure 9:
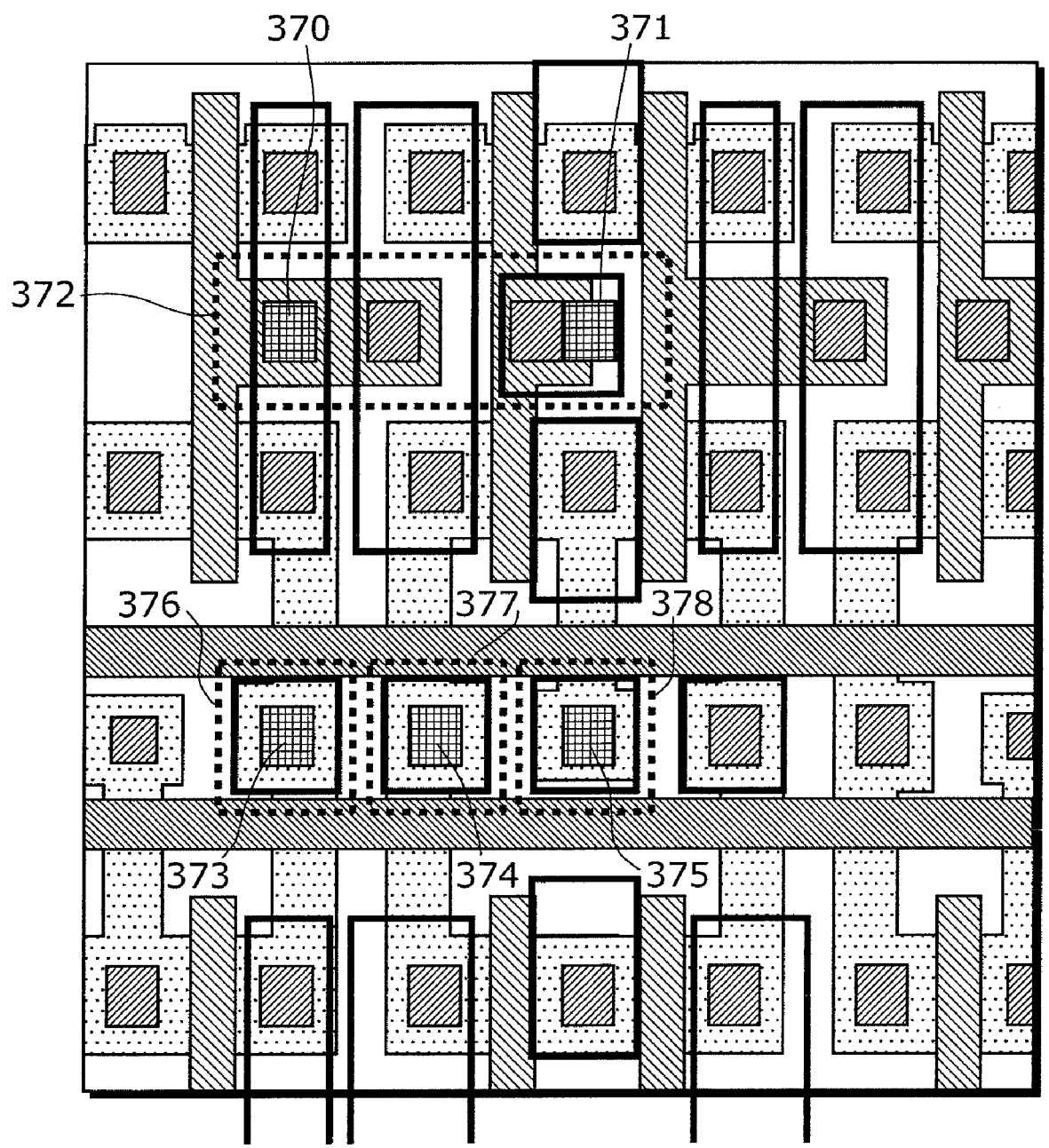
FIG. 9 is a diagram which shows a layout placement of layers up to a second metal wiring layer of the combination memory device according to the first embodiment of the present invention.

FIG. 9 is a diagram which shows a layout of layers up to a second metal wiring layer of the memory cell region of the combination memory device 100.

Wires 372 and 376 to 378 as shown in FIG. 9 are formed by using the second metal wiring layer. Further, via contact holes (VIA) 370, 371, and 373 to 375 connect the first metal wiring layer and the second metal wiring layer.

The wire 372 connects the wire 361 and the wire 365 via the VIA 370 and the 371.

The wires 376, 377, and 378 connect to the wires 368, 367, and 369 via the VIAs 373, 374, and 375, respectively.

Figure 10:
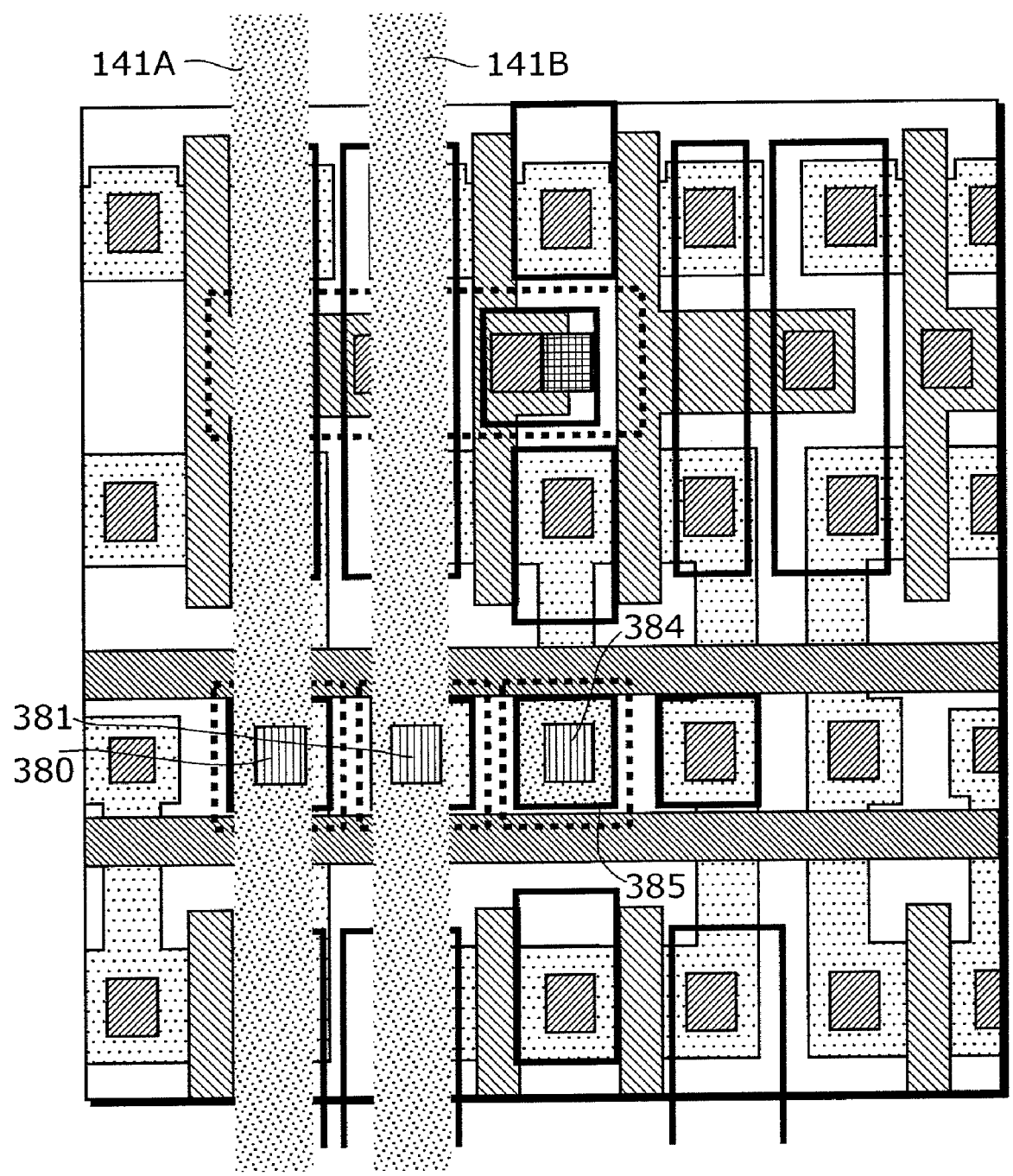
FIG. 10 is a diagram which shows a layout placement of layers up to a third metal wiring layer of the combination memory device according to the first embodiment of the present invention.

FIG. 10 is a diagram which shows a layout of layers up to a third metal wiring layer of the memory cell region of the combination memory device 100.

A wire 385 and the RAM bit lines 141A and 141B as shown in FIG. 10 are formed by using the third metal wiring layer. Further, VIA 380, 381, and 384 are via contact holes connecting the second metal wiring layer and the third metal wiring layer.

The wire 385 connects to the wire 378 via the VIA 384.

The RAM bit lines 141A and 141B connect to the wires 376 and 377 via the VIAs 380 and 381, respectively. Further, the RAM bit lines 141A and 141B are placed along the column direction.

Figure 11:
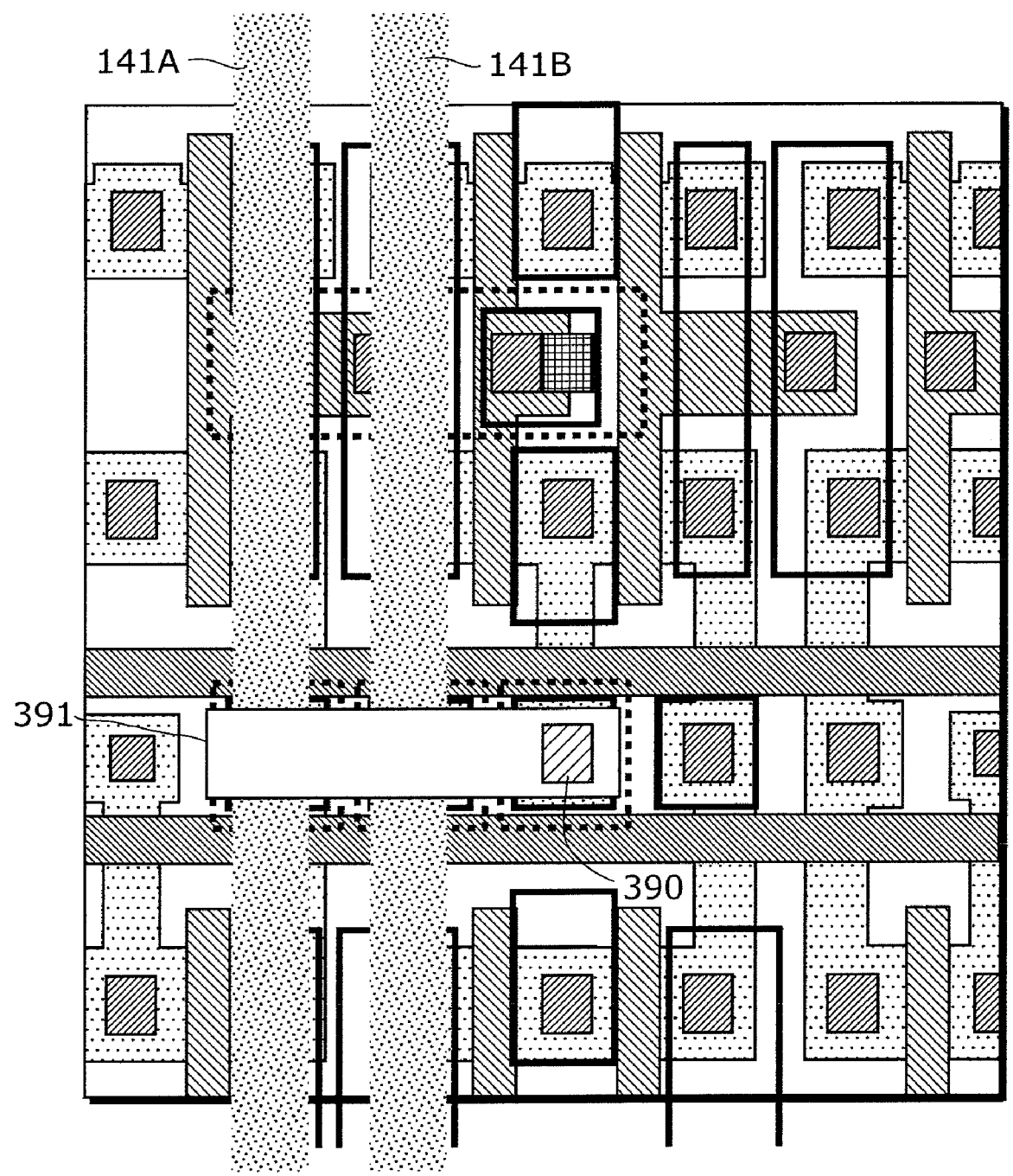
FIG. 11 is a diagram which shows a layout placement of layers up to a forth metal wiring layer of the combination memory device according to the first embodiment of the present invention.

FIG. 11 is a diagram which shows a layout of layers up to a fourth metal wiring layer of the memory cell region of the combination memory device 100.

A wire 391 as shown in FIG. 11 is formed by using the forth metal wiring layer. Further, a VIA 390 is a via contact hole connecting the third metal wiring layer and the forth metal wiring layer.

The wire 391 connects to the wire 385 via the VIA 390.

Figure 12:
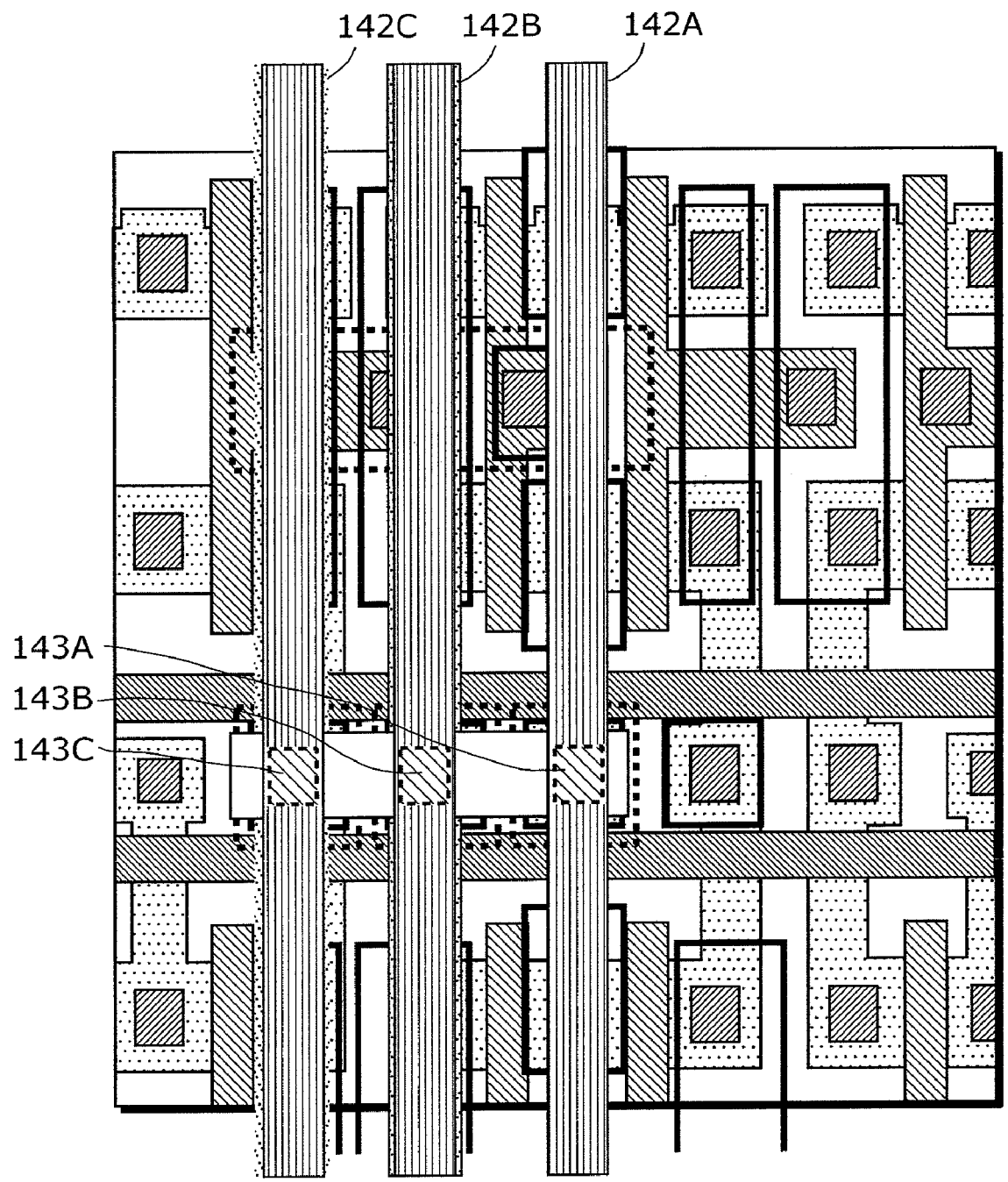
FIG. 12 is a diagram which shows a layout placement of layers up to a fifth metal wiring layer of the combination memory device according to the first embodiment of the present invention.

FIG. 12 is a diagram which shows a layout of layers up to a fifth metal wiring layer of the memory cell region of the combination memory device 100.

ROM bit lines 142A to 142C as shown in FIG. 12 are formed by using the fifth metal wiring layer. Further, the contacts 143A to 143C are via contact holes connecting the fourth metal wiring layer and the fifth metal wiring layer.

The ROM bit lines 142A, 142B, and 142C connect to the wire 391 via the contact 143A, 143B, and 143C, respectively. Further, the ROM bit lines 142A to 142C are placed along the column direction.

It is to be noted that the ROM cell 130 outputs data determined depending on which one of or none of the contacts 143A to 143C is formed, as described above.

Figure 13A:
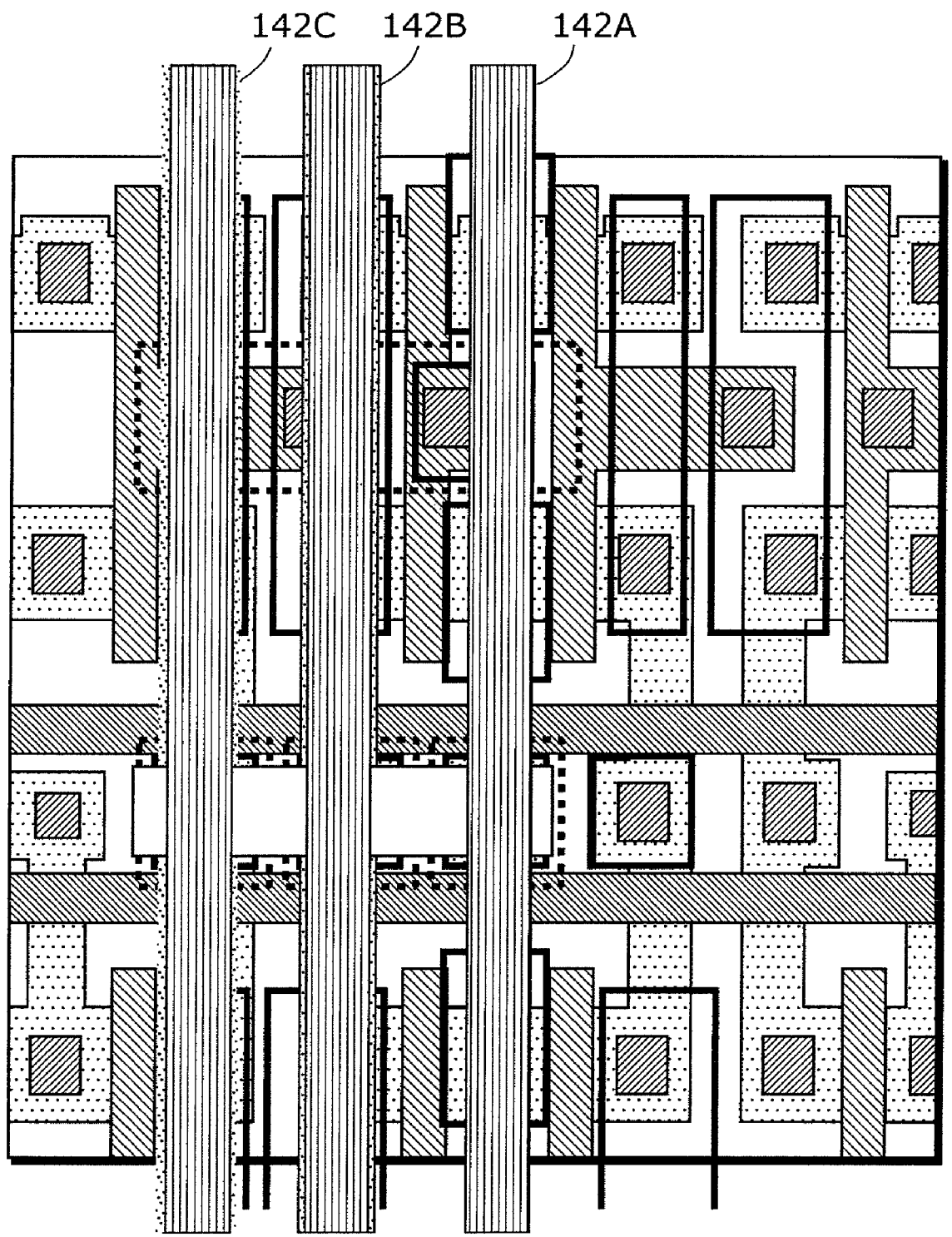
FIG. 13A is a diagram which shows a layout placement of layers up to the fifth metal wiring layer of the combination memory device according to the first embodiment of the present invention.
Figure 13B:
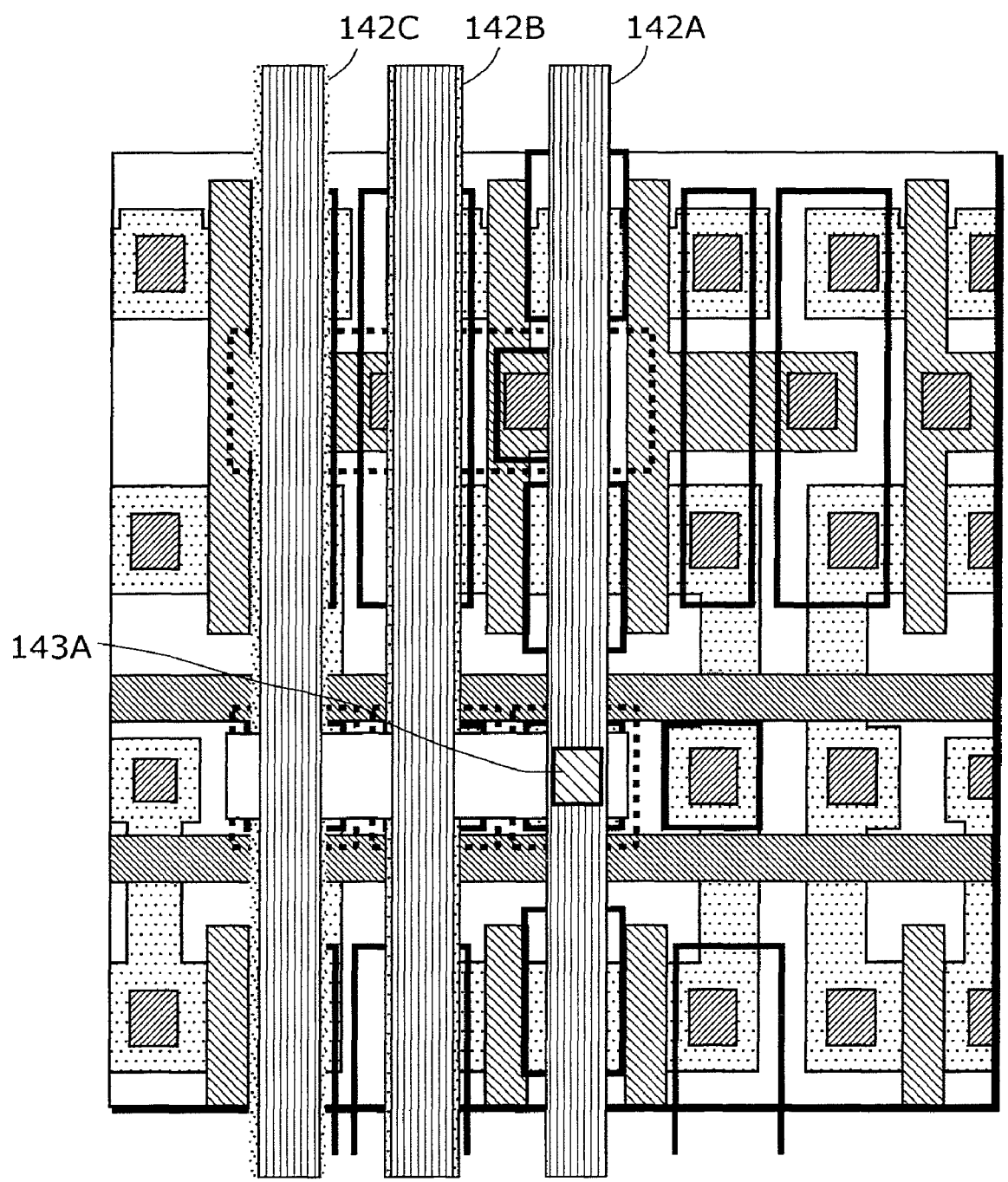
FIG. 13B is a diagram which shows a layout placement of layers up to the fifth metal wiring layer of the combination memory device according to the first embodiment of the present invention.
Figure 13C:
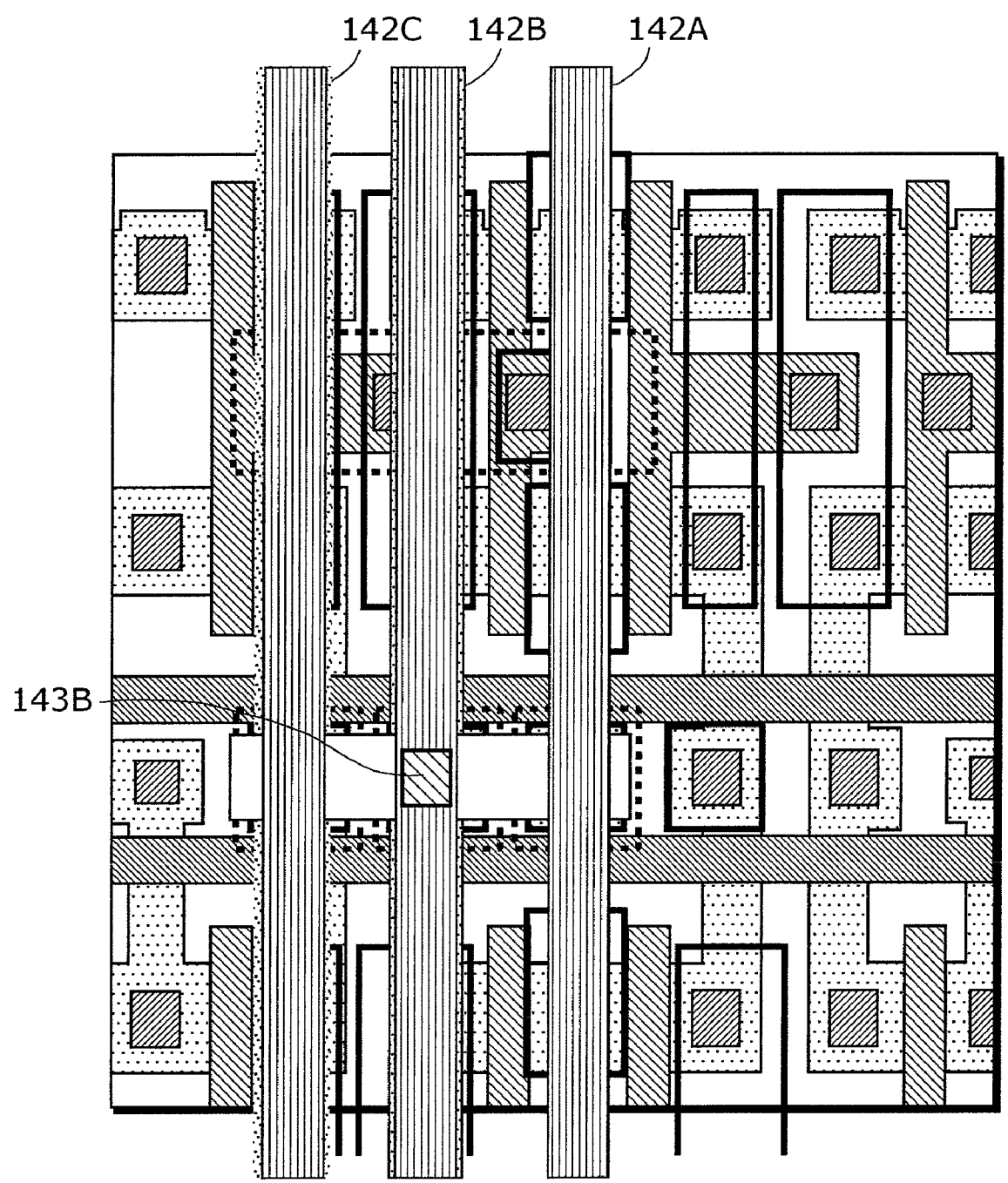
FIG. 13C is a diagram which shows a layout placement of layers up to the fifth metal wiring layer of the combination memory device according to the first embodiment of the present invention.
Figure 13D:
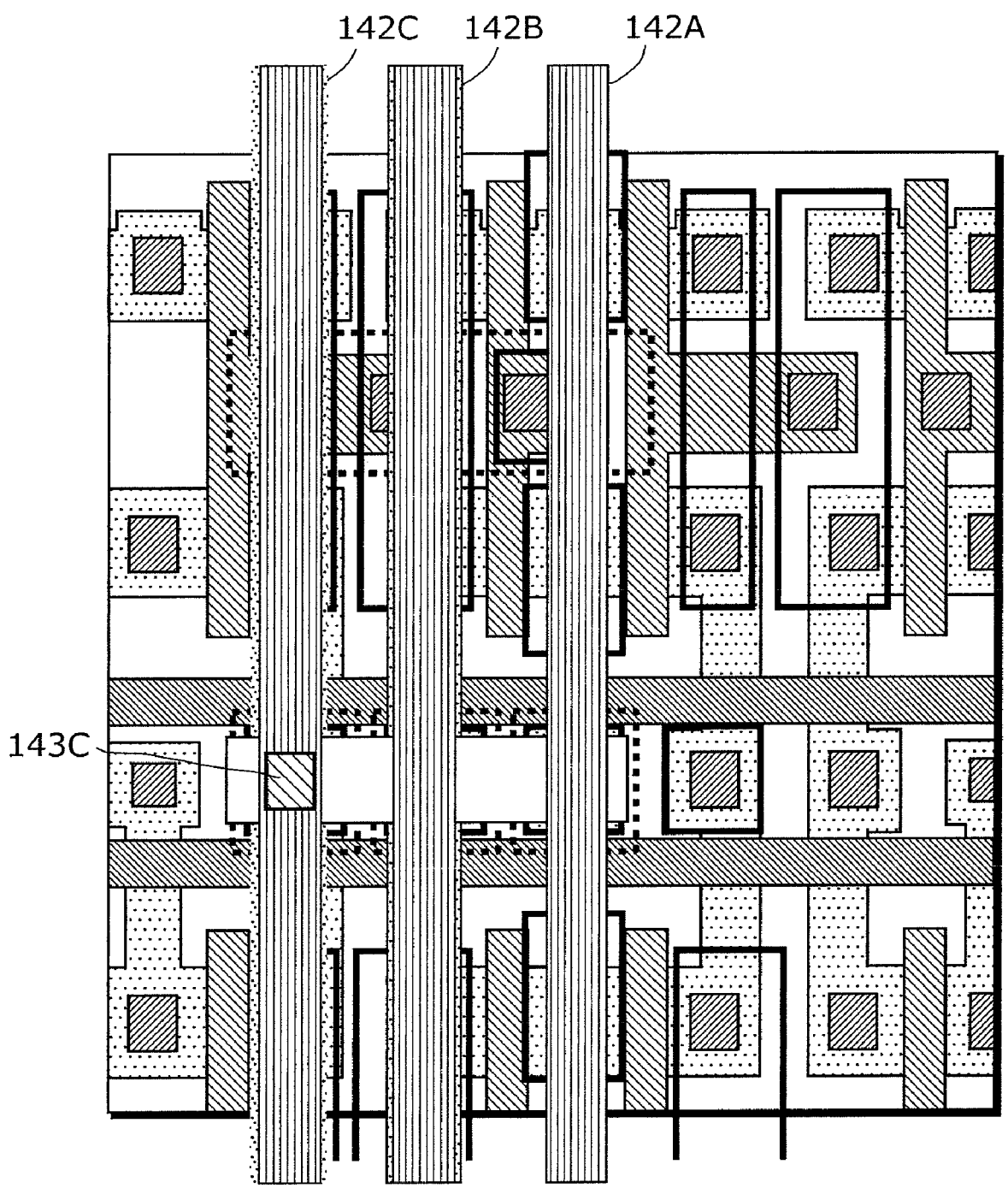
FIG. 13D is a diagram which shows a layout placement of layers up to the fifth metal wiring layer of the combination memory device according to the first embodiment of the present invention.

FIG. 13A is a diagram which shows a layout of the memory cell region of the combination memory device 100 in the case where none of the contacts 143A to 143C is formed. FIGS. 13B, 13C, and 13D are diagrams which show layouts of the memory cell of the combination memory device 100. FIGS. 13B, 13C, and 13D respectively show the cases where: only the contact 143A is formed; only the contact 143B is formed; and only the contact 143C is formed.

According to the above-described configuration, the combination memory device 100 can embody a memory cell area equivalent to that of a memory device including only the SRAM. The reason for that will be described below.

Figure 14:
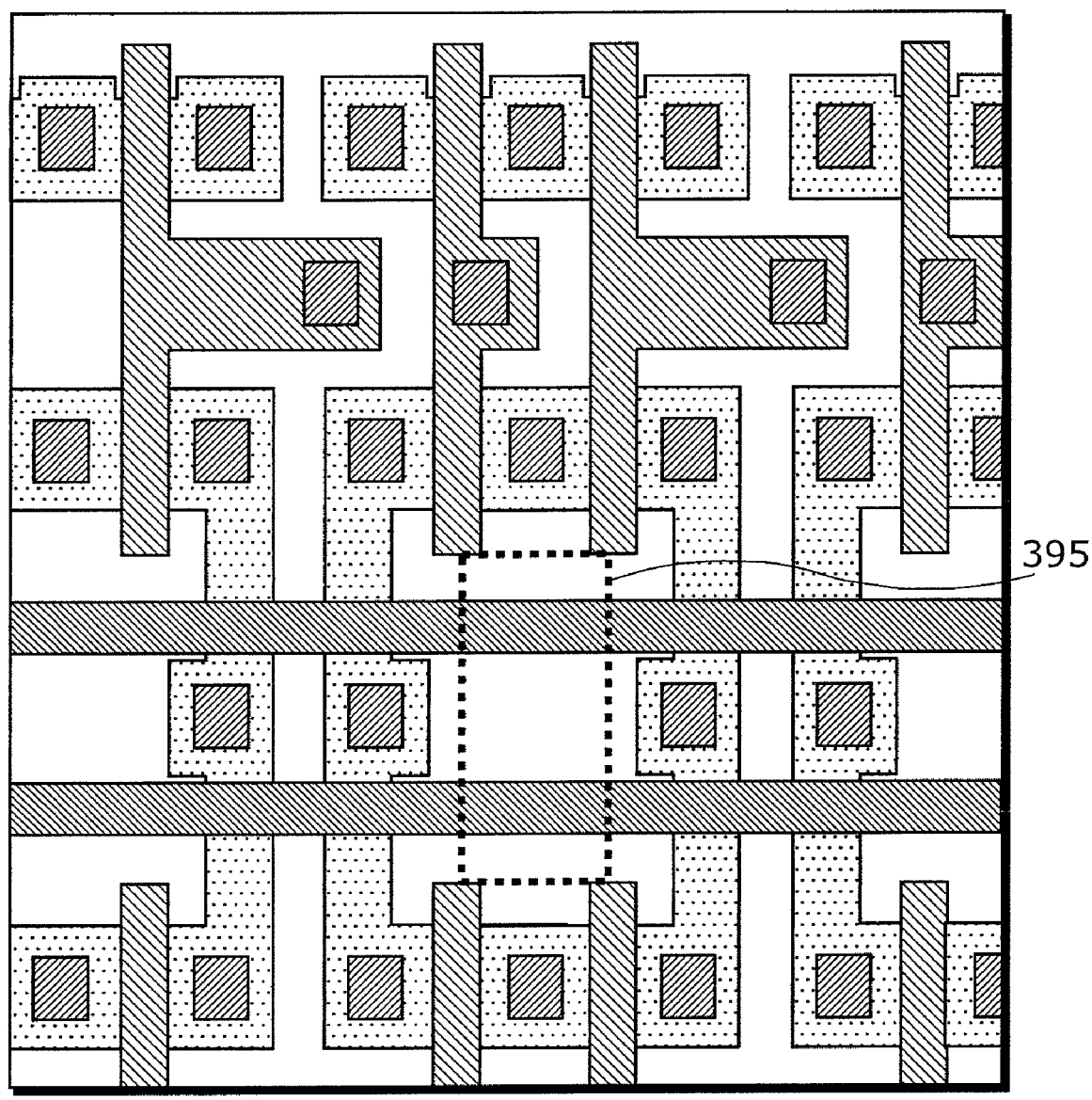
FIG. 14 is a diagram which shows a layout placement of an SRAM.

FIG. 14 is a diagram which is used for comparison and shows a layout placement of the memory cell region of the SRAM.

As shown in FIG. 14, a region 395 surrounded by the word lines 140A and 140B and the diffusion regions 308 and 310 as shown in FIG. 7 is a free space in which an element is not placed, in the memory cell region of the SRAM. As shown in FIG. 7, the transistor T7 of the ROM cell 130 is placed in the region 395 according to the combination memory device 100. Accordingly, the combination memory device 100 can embody a memory cell area equivalent to that of a memory device including only the SRAM.

More specifically, the memory cell size in the row direction (X direction) is determined by summing up X1, X2, X3 and L, where X1 is a minimum distance between an edge of the diffusion regions 304 and 305 and the contacts of the diffusion regions 304 and 305, respectively, each of the diffusion regions and corresponding one of the contacts being overlapped, X2 is a minimum width of the contacts of the diffusion regions 303, 304, and 305, X3 is a minimum distance between the polysilicon lines 301 and 302 and the contacts of the diffusion regions 303, 304, and 305, and L is a minimum width of the polysilicon lines 301 and 302. It is to be noted that since the diffusion region 303 is the common source region of the transistors T1 and T3, the width in the X direction does not increase even when the diffusion region 303 also serves as a source regions of the transistor T7. Therefore, the size in the X direction does not increase by adding the transistor T7.

Likewise, the memory cell size in the column direction (Y direction) is determined by summing up Y1, Y2, Y3, Y4, Y5 and Y6, where Y1 is a minimum distance between an edge of the diffusion region 305 and the contact of the diffusion regions 305, the diffusion region and the contacts being overlapped, Y2 is a minimum width of the contacts of the diffusion regions 305 and 310, Y3 is a minimum length of the polysilicon line 302 protruding from the diffusion region 305, Y4 is a minimum distance between the polysilicon line 302 and the word line 140A, Y5 is a minimum width of the word line 140A, and Y6 is a minimum distance between the word line 140A and the contact of the diffusion region 310.

Here, since the contacts of the diffusion regions 308, 310, and 312 are formed in the row direction, the length in the Y direction does not increase by adding the diffusion region 312 and the contact of the diffusion region 312. Therefore, the size in the Y direction does not increase by adding the transistor T7.

As described above, the combination memory device 100 can embody a memory cell area equivalent to that of a memory device including only the SRAM. It is to be noted that the minimum width, the minimum distance, and the like described above are the minimum width, the minimum distance, and the like according to the design rule.

Further, as described above, the first memory cell 110 and the second memory cell 111 are arranged in a zigzag pattern in the combination memory device 100. That is, one ROM cell 130 is provided for two memory cells. The reason for employing such a zigzag pattern will be described below.

For example, it is possible to form the transistor T7 in the second memory cell 111A in the same manner as the first memory cell 110A. In this case, however, the diffusion region 312 is shared by the first memory cell 110A and the second memory cell 111A. Accordingly, the contact unit 131 connected to the diffusion region 312 is also shared by the first memory cell 110A and the second memory cell 111A. Therefore, it is not possible to set data individually on the first memory cell 110A and the second memory cell 111A.

In addition, it is possible to place the ROM cell 130 in every memory cell by providing the diffusion region 312 individually in the first memory cell 110A and the second memory cell 111A. In this case, however, it is necessary to increase the area of the memory cell region.

On the other hand, it is possible to set data individually on each of the ROM cells 130 by employing the zigzag pattern in the combination memory device 100. Further, with the combination memory device 100, it is possible to prevent an increase in the area of the memory cell region by providing one ROM cell 130 for two memory Further, the combination memory device 100 according to the first embodiment of the present invention includes three ROM bit lines 142 for one ROM cell 130. This enables one ROM cell 130 to store data in four patterns, that is, 2-bit data. Thus, the capacities of the SRAM and the ROM can be the same even in the case where one ROM cell 130 is provided for two memory cells.

Further, with the combination memory device 100 according to the first embodiment of the present invention, it is possible to prevent an increase in the area of the memory cell region, which is caused by providing three ROM bit lines 142.

Here, in a memory device including the ROM only, one memory cell includes one transistor. Thus, in the case where plural bit lines are provided for one memory cell, the area of the plural bit lines become larger than the area of the transistor and the like. More specifically, the area of the memory cell directly increases by having the larger number of bit lines.

On the other hand, in the combination memory including the SRAM and the ROM, one memory cell includes six or seven transistors. More specifically, the area of a single memory cell in the combination memory is much larger than the area of a single memory cell in the memory device including the ROM only. Thus, it is not necessary to increase the area of the memory cell even in the case where three ROM bit lines 142 are provided, as shown in FIG. 12.

Further, in the combination memory device 100, the RAM bit line 141 and the ROM bit line 142 are respectively formed in different metal wiring layers. This makes it possible to suppress an increase in the area of the memory cell, which is caused by providing plural ROM bit lines 142.

Further, it is possible to prevent a malfunction resulting from an interaction of the RAM bit line 141 and the ROM bit line 142, by forming the RAM bit line 141 and the ROM bit line 142 respectively on different metal wiring layers.

Further, in the case where plural ROM bit lines 142 are provided, the closer the distance between adjacent ROM bit lines 142 is, the greater amount of an unnecessary parasitic capacitance occurs between the ROM bit lines 142, resulting in erroneous reading. More specifically, when one ROM bit line 142 is discharged, the other ROM bit line 142 adjacent to the discharged ROM bit line 142 is affected by the discharge through the parasitic capacitance, making it impossible to hold a precharged potential. This triggers discharge in the adjacent ROM bit line 142, resulting in erroneous reading in the adjacent ROM bit line 142. Therefore, it is preferable to place plural ROM bit lines 142 to be apart from each other as much as possible. As described above, the area of the memory cell is large in the combination memory, and thus it is possible to ensure a sufficient space in wiring even when three ROM bit lines 142 are provided.

Accordingly, with combination memory device 100 according to the first embodiment of the present invention, it is possible to suppress an increase in a parasitic capacitance of the ROM bit line 142 without increasing the area of the memory cell region even in the case where three ROM bit lines 142 are provided.

As described above, with combination memory device 100 according to the first embodiment of the present invention, it is possible to implement, in addition to the SRAM function, the ROM function having the same capacity as the SRAM, while maintaining the area of the memory cell region equivalent to the area of the memory cell region including only the SRAM.

The combination memory device 100 according to the first embodiment of the present invention has been described above, however, the present invention is not limited to this embodiment.

For example, the contact unit 131 includes one contact 143 at most in the above description, however, two or more contacts 143 may be Included. In this case, although the speed of reading from the ROM cell 130 is lowered, it is possible to store data in eight patterns, that is, 3-bit data in one ROM cell 130, by providing the contact unit 131 with 0 to three contacts, for example. Thus, the capacity of the ROM of the combination memory device 100 can be increased by 1.5 times.

Further, three ROM bit lines 142 are included according to the above description, however, the number of the ROM bit lines 142 may be one, two, ore four or more. It is possible to increase the capacity of the ROM by increasing the number of the ROM bit lines 142. It is to be noted that it is preferable, in consideration of an increase of the area, to include the number of the ROM bit lines 142 so as to be placed within the width (length in the row direction) of one memory cell.

Further, one ROM cell 130 is provided for two addresses (memory cell) in the above description, however, one ROM cell 130 may be provided for three or more addresses.

Further, the first memory cell 110 and the second memory cell 111 are arranged in a zigzag pattern in the above description, however, the present invention is not limited to this.

For example, the first memory cell 110 and the second memory cell 111 may be placed alternately in the row direction and so as to be repeated in the following order: the first memory cell 110, the second memory cell 111, the second memory cell 111, and the first memory cell 110 in the column direction. The same advantage as in the case of employing the zigzag pattern may be obtained also in this case.

Further, in order to place the SRAM and the ROM without increasing the area of the memory cell region, it is sufficient that at least one first memory cell 110 is adjacent to at least one second memory cell 110. This makes it possible to place the transistor T7 of the first memory cell 110 in an area 395 shown in FIG. 14. In other words, it is sufficient to place memory cells including the first memory cell 110 and the second memory cell 111 in a matrix.

For example, the first memory cell 110 and the second memory cell 111 may be placed alternately in stripes in the column direction. More specifically, the first row including only the first memory cell 110 and the second row including only the second memory cell 111 may be placed alternately. Further, the first row and the second row may be placed so as to be repeated in the following order: the first row, the second row, the second row, and the first row in the column direction. It is to be noted that the ROM column selector 156 as shown in FIG. 1 needs to be provided for every columns in the case where the first memory cell 110 and the second memory cell 111 are placed in the above-described manner.

Further, in the above description, the first memory cell 110 and the second memory cell 111 are divided so that the diffusion regions 313 and 303 are placed on the boundary between the first memory cell 110 and the second memory cell 111 in the row direction as shown in FIG. 7, however, the first memory cell 110 and the second memory cell 111 may be divided so that the diffusion regions 313 and 303 are placed at the center of the first memory cell 110 and the second memory cell 111 in the row direction.

Further, a row is selected with higher-order bits of the address signal ADD and a column is selected with lower bits in the above description, however, the present invention is not limited to this. Further, the address used by the encoding circuit 172 is not limited to the least significant address of the address signal ADD.

Further, the layout as shown in FIGS. 7 to 13D is an example, and may be modified arbitrarily while maintaining the characteristics and advantages of the present invention.

Second Embodiment

A combination memory device according to a second embodiment of the present invention includes an SRAM cell 120 and a ROM cell 130 in each memory cell.

Figure 15:
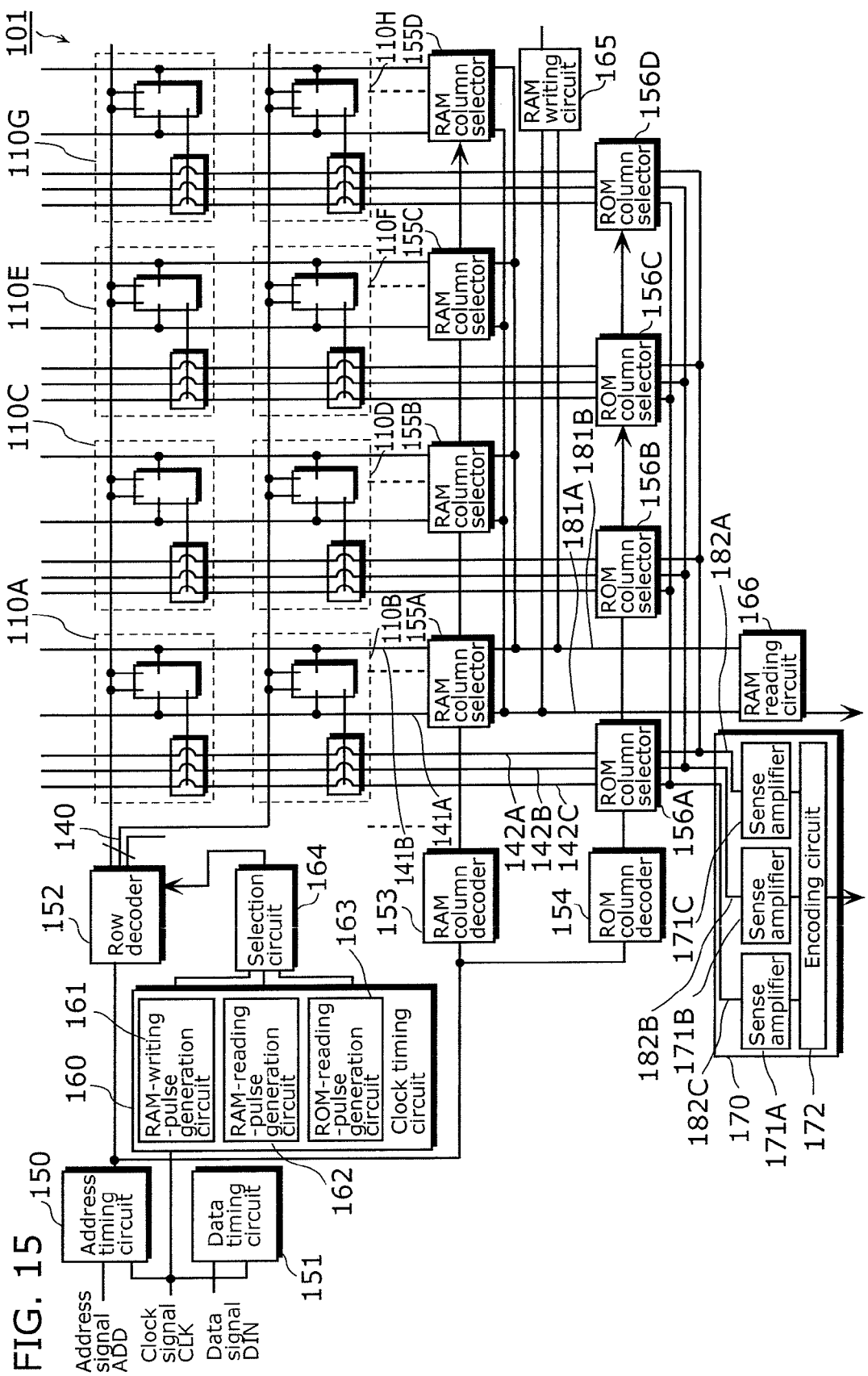
FIG. 15 is a block diagram which shows a configuration of a combination memory device according to a second embodiment of the present invention.

FIG. 15 is a diagram which shows a configuration of a combination memory device 101 according to the second embodiment of the present invention. It is to be noted that the same numerals are assigned to the same elements as in FIG. 1 and the description will be focused on the differences, while omitting the overlapping portion.

A combination memory device 101 in FIG. 15 is different from the combination memory device 100 according to the first embodiment in that: all of the memory cell is the first memory cell 110; and the ROM column selector 156 is provided for each column.

According to the configuration described above, the combination memory device 101 according to the second embodiment can have a ROM capacity twice as much as that of the combination memory device 100 according to the first embodiment. However, in the combination memory device 101 according to the second embodiment, the area of the memory cell region is larger than the area of the memory cell region of the combination memory device 100 according to the first embodiment.

It is to be noted that the ROM cell 130 may determine data to be outputted depending on whether a diffusion region is included or not, instead of depending on whether a contact is included or not.

A modification of the combination memory device 101 according to the second embodiment will be described below.

Figure 16:
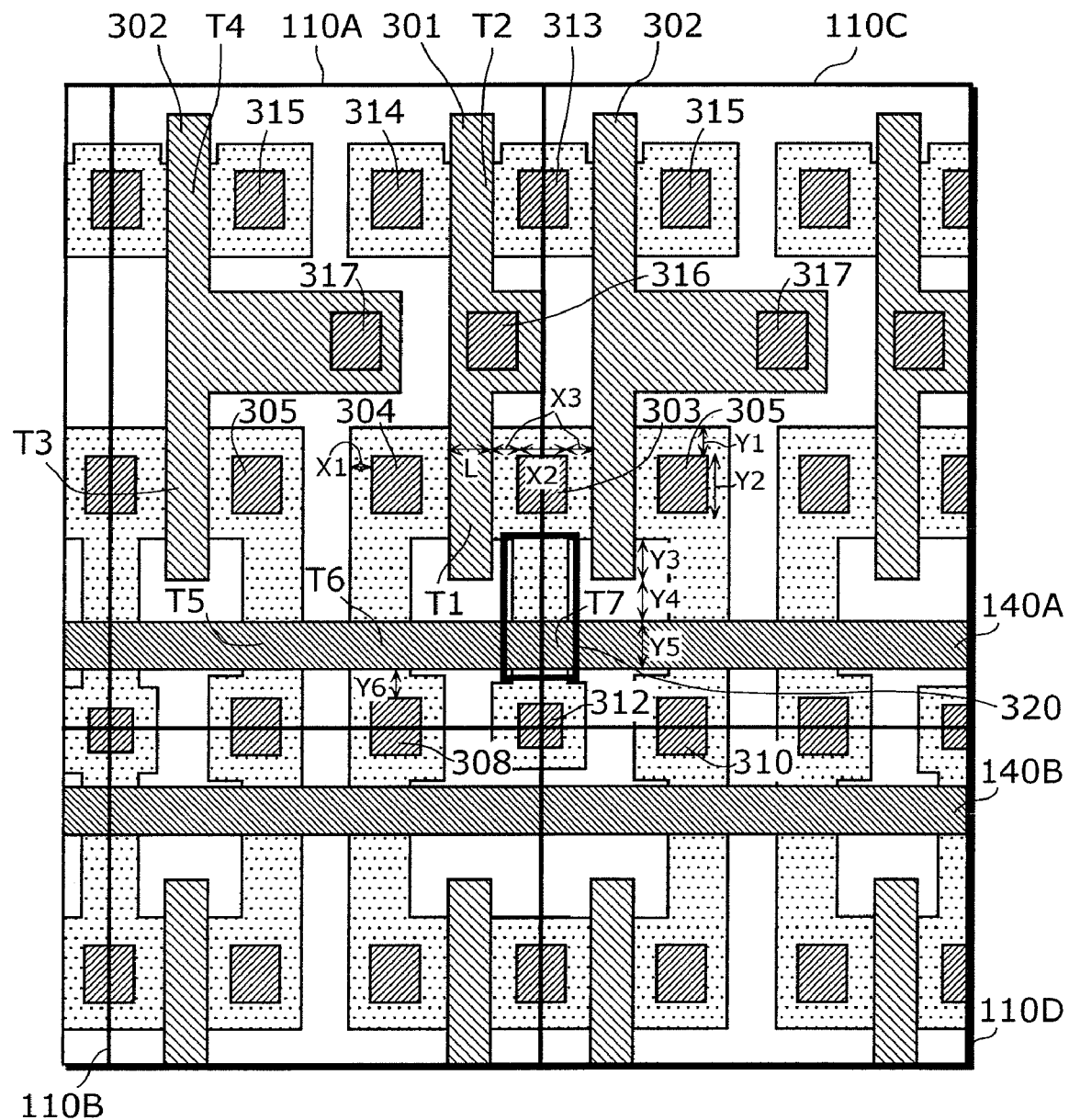
FIG. 16 is a diagram which shows a layout placement of the combination memory device n a modification of the second embodiment of the present invention.

FIG. 16 is a diagram which shows a layout placement of the memory region in the case where data to be outputted is determined depending on whether a diffusion region is included or not. The ROM cell 130 outputs data determined depending on whether or not a diffusion region placed in the region 320 as shown in FIG. 16 is included. In other words, the ROM cell 130 outputs data determined depending on whether or not the transistor T7 is included.

It is to be noted that the ROM cell 130 may output data determined depending on whether or not a diffusion region which connects the source and the GND of the transistor T7 is included. More specifically, when storing "1" in the ROM cell 130, the source and the GND of the transistor T7 is made nonconductive by not forming a portion of the diffusion region of the region 320 along a path from the channel portion of the transistor T7 (under the word line 140A) through the contact of the diffusion region 303. Further, when storing "0" in the ROM cell 130, the source and the GND of the transistor T7 is made conductive by forming the diffusion region.

Further, in the case where the ROM cell 130 determines data to be outputted depending on whether the diffusion region is included or not, the combination memory device 101 can embody the area of the memory cell region which is the same as in the combination memory device 100 according to the first embodiment, that is, as in the case of the SRAM only. The reason is that data to be outputted by the ROM cell 130 can be determined in the region 320 which is between the contact of the diffusion region 303 connected to the GND and the diffusion region 312 (the drain of the transistor T7) shared by two memory cells.

It is to be noted that in the case where the ROM cell 130 determined data to be outputted depending on whether the diffusion region is included or not, the ROM cell 130 cannot output data in four patterns. More specifically, the combination memory device 100 according to the first embodiment has an advantage of allowing multi-valuation in the ROM cell 130, which is an advantage the combination memory device 101 according to the second embodiment does not have.

Third Embodiment

A combination memory device according to a third embodiment of the present invention includes an SRAM cell 120 and a ROM cell 130 in each memory cell. Further, one piece of data is outputted from two ROM cells 130 included in two memory cells placed in the column direction.

Figure 17:
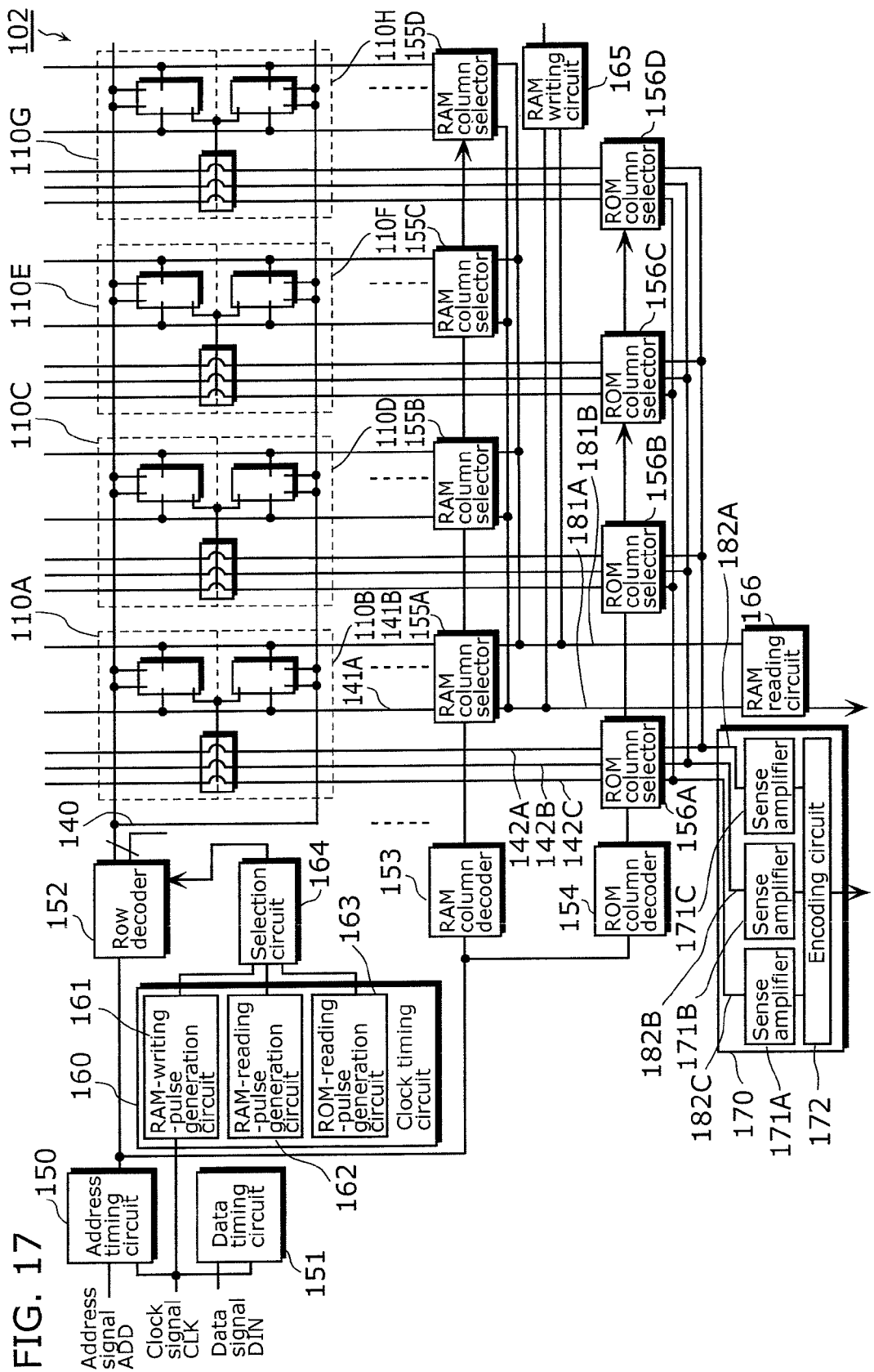
FIG. 17 is a block diagram which shows a configuration of a combination memory device according to a third embodiment of the present invention.

FIG. 17 is a diagram which shows a configuration of a combination memory device 120 according to the third embodiment of the present invention. The combination memory device 120 as shown in FIG. 17 is different from the combination memory device according to the second embodiment in that the word line 140 is short-circuited for every two columns.

According to the configuration as described above, in the combination memory device 102 according to third embodiment of the present invention, since the transistors T7 of the ROM cell 130 are connected in parallel, the drive capability of the ROM cell 130 can be improved. Accordingly, the combination memory device 102 can improve the ROM reading speed.

Further, as described in the first embodiment, 2-bit data can be stored in two ROM cells connected in parallel, by using three ROM bit lines 142. Therefore, the capacity of the ROM is not decreased.

Fourth Embodiment

In the fourth embodiment of the present invention, a flash microcomputer including the combination memory device 100 described in the first embodiment will be described.

First, a configuration of the flash microcomputer according to the fourth embodiment of the present invention will be described.

Figure 18:
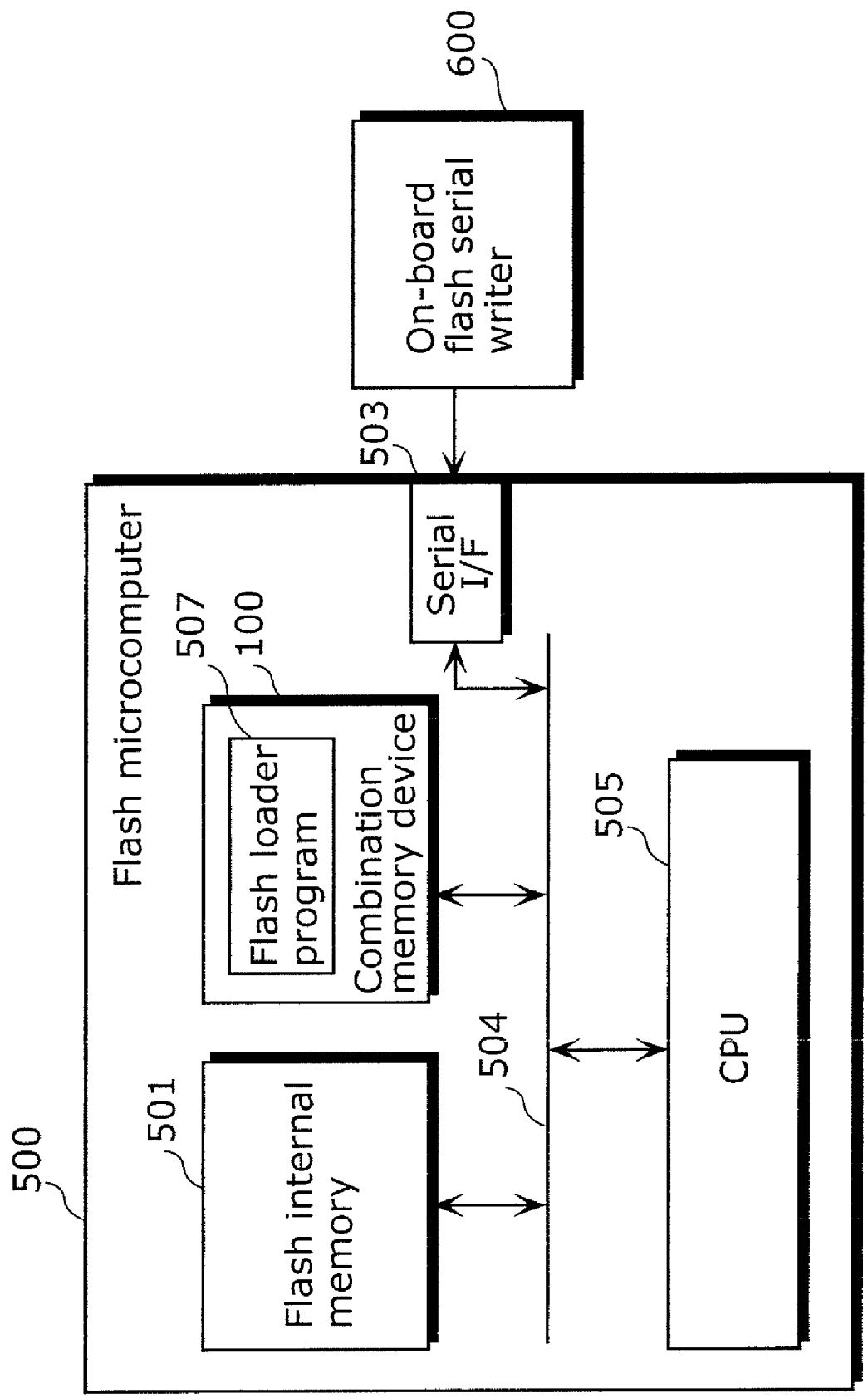
FIG. 18 is a block diagram which shows a configuration of a Flash microcomputer according to a fourth embodiment of the present invention.
Figure 19:
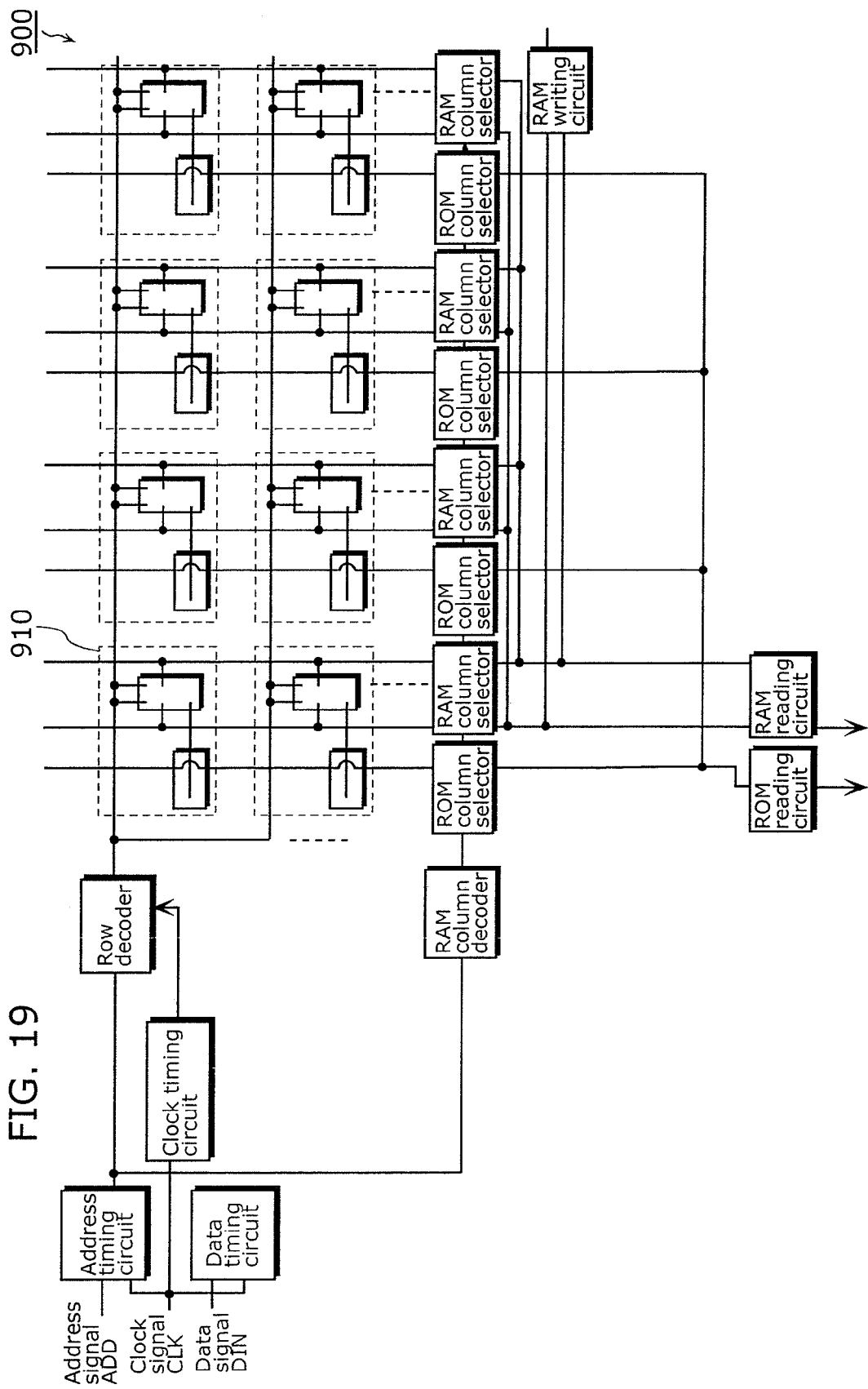
FIG. 19 is a block diagram which shows a configuration of a conventional combination memory device.
Figure 20:
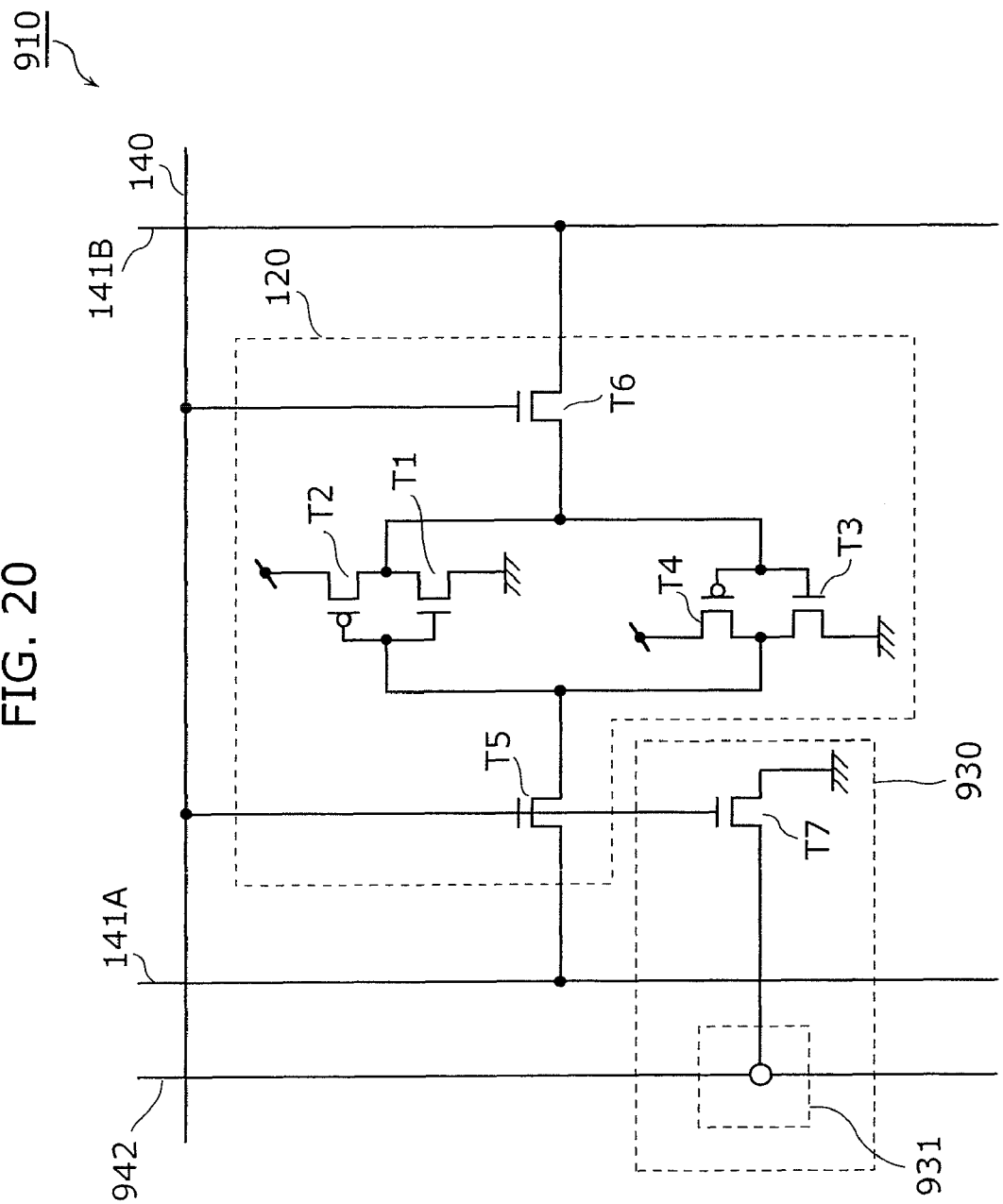
FIG. 20 is a circuit diagram which shows a configuration of a memory cell of the conventional combination memory device.

FIG. 18 is a block diagram which shows the configuration of a flash microcomputer 500 according to the fourth embodiment of the present invention.

The flash microcomputer 500 as shown in FIG. 18 connects to an on-board flash serial writer 600. Further, the flash microcomputer 500 includes: a combination memory device 100; a flash internal memory 501; a serial interface (I/F) 503; an internal bus 504; and a CPU 505.

The on-board flash serial writer 600 rewrites data to be stored in the flash internal memory 501, by providing the flash microcomputer 500 with an instruction.

The flash internal memory 501 is a nonvolatile flash memory.

The serial I/F 503 passes data between the on-board flash serial writer 600 and the Flash microcomputer 500.

The internal bus 504 connects to: the combination memory device 100; the flash internal memory 501; the serial I/F 503; and the CPU 505, and is used for passing data between the flash internal memory 501, the serial I/F 503, and the CPU 505.

The combination memory device 100 is the combination memory device according to the afore-mentioned first embodiment. A flash loader program 507 is stored in the ROM of the combination memory device 100. The flash loader program 507 is a program for writing data specified by the on-board flash serial writer 600 on the flash internal memory 501.

The CPU 505 executes the flash loader program 507 stored in the combination memory device 100, thereby obtaining data for rewrite which is outputted from the on-board flash serial writer 600. Further, the CPU executes the flash loader program 507, thereby rewriting data stored in the flash internal memory 501 as the data for rewrite which has been obtained.

On the other hand, an SRAM has been used instead of combination memory device 100 in conventional flash microcomputers. In this case, the CPU 505 executes a boot program in a boot region of the SRAM, thereby downloading the flash loader program 507 from the on-board flash serial writer 600 onto the SRAM. The CPU 505 executes the flash loader program 507, thereby rewriting the data of the flash internal memory 501.

More specifically, since a ROM does not include the built-in flash loader program 507 in the conventional flash microcomputer, it is necessary to download the flash loader program 507 onto the internal RAM every time a chip changes and to execute the flash loader program 507 which has been downloaded. This slows down rewriting of the conventional flash microcomputer. Further, since the SRAM region that could desirably be used for other purposes is used for storing the flash loader program 507 in the conventional flash microcomputer, it is necessary to mount an SRAM with a large capacity in consideration of storing the flash loader program 507. This leads to a problem that a chip area becomes larger in the conventional flash microcomputer.

The flash microcomputer 500 according to the forth embodiment of the present invention, the flash loader program 507 is stored in advance in the ROM of the combination memory device 100, and thus there is no need to download the flash loader program 507 from the on-board flash serial writer 600. This makes it possible for the flash microcomputer 500 to shorten the time taken for rewriting.

Further, since there is no need to store the flash loader program 507 in the SRAM, an SRAM with a minimum necessary capacity is sufficient to be mounted. This makes it possible to reduce the chip size of the flash microcomputer 500. For example, in the case where about a half of the capacity of the SRAM is conventionally used for storage of the flash loader program 507, it is possible to halve the capacity of the SRAM (combination memory device 100) to be stored, approximately, in the flash microcomputer 500 according to the forth embodiment of the present invention.

Further, the combination memory device 100 can be implemented with the same amount of area as in the case of the SRAM only as described above. Accordingly, in the case where about a half of the capacity of the SRAM is conventionally used for storage of the flash loader program 507, there is no need to newly store the ROM, and it is possible to significantly reduce the area of the combination memory device 100 compared to the area of the conventional SRAM, with the flash microcomputer 500 according to the forth embodiment of the present invention. Therefore, it is possible to significantly reduce the chip size of the flash microcomputer 500 according to the forth embodiment of the present invention.

It is to be noted that the flash microcomputer 500 may include, instead of the combination memory device 100, the combination memory device 101 or 102 according to the second embodiment or the third embodiment, respectively.

Further, an example of mounting the combination memory device 100 in the flash microcomputer 500 has been described above, however, the combination memory devices 100, 101, and 102 may be mounted in a variety of semiconductor devices with an internal memory, in which the SRAM and the ROM are used.

Industrial Applicability

The present invention can be applied to combination memory devices in which an SRAM and a ROM are mounted together, and in particular to a semiconductor device with an internal memory in which the SRAM and the ROM are used, such as a flash microcomputer.

What is claimed is:
1. A combination memory device including a static random access memory (SRAM) and a read only memory (ROM), said combination memory device comprising
first memory cells and second memory cells arranged in rows and columns, wherein each of said first memory cells includes an SRAM cell and a ROM cell and is arranged adjacent to at least one of said second memory cells, each of said second memory cells includes an SRAM cell and does not include a ROM cell, and each of said first memory cells and each of said second memory cells are placed alternately in a row direction and in a column direction.

2. The combination memory device according to claim 1, further comprising:

a word line provided for each row for selecting said SRAM cells and said ROM cells in the row;

a first bit line and a second bit line each provided for each column, for reading data from said SRAM cells in the column and for writing data on said SRAM cells; and a third bit line provided for each column for reading data from said ROM cells in the column.

3. The combination memory device according to claim 2, wherein said SRAM cell includes:

a first inverter having an input terminal connected to a first node, and an output terminal connected to a second node;

a second inverter having an input terminal connected to the second node, and an output terminal connected to the first node;

a first transistor having a first terminal connected to the first node, a second terminal connected to said first bit line, and a gate connected to said word line, said first terminal being one of a drain and a source, said second terminal being the other of the drain and the source; and a second transistor having a first terminal connected to the second node, a second terminal connected to said second bit line, and a gate connected to said word line, said first terminal being one of a drain and a source, said second terminal being the other of the drain and the source, and wherein said ROM cell includes a third transistor having a source connected to a ground (GND), and a gate connected to said word line, and said ROM cell outputs, to said third bit line, data determined depending on whether or not a contact is included, said contact connecting said drain of said third transistor to said third bit line.

4. The combination memory device according to claim 3, wherein a part of a region of said third transistor included in each of said first memory cells is placed in a region of corresponding one of said second memory cells adjacent to said first memory cell.

5. The combination memory device according to claim 4, wherein in said first memory cells and said second memory cells, said first and second inverters and said first and second transistors are sequentially positioned in order, starting from a first end to a second end, in the column direction, each of said first memory cells and each of said second memory cells is positioned such that: a first end of one of said first memory cells faces a first end of a corresponding one of said second memory cells adjacent to each other in the column direction; or a second end of one of said first memory cells faces a second end of a corresponding one of said second memory cells adjacent to each other in the column direction, and a part of the region of said third transistor included in each of said first memory cells is on a boundary between said first memory cells and said second memory cells on the second end.

6. The combination memory device according to claim 5, wherein said first transistor, said second transistor, and said third transistor, each of which is included in said first memory cells and said second memory cells in each row, are aligned in the row direction, said first inverter and said second inverter included in said first memory cells and said second memory cells in each row are aligned in the row direction, said gates of said first transistor, said second transistor, and said third transistor included in said first memory cells and second memory cells in each row, comprise a common polysilicon line, said first terminals of said first transistors included in said first memory cells and said second memory cells adjacent to each other at the second ends comprise a first diffusion region on the boundary on the second ends, and said first terminal of said second transistors comprise a second diffusion region on the boundary on the second ends, said first diffusion region and said second diffusion region being shared by corresponding first terminals, said source of said ROM cell is a third diffusion region shared by the GNDs of said first inverter and said second inverter adjacent to each other in the row direction, and a fourth diffusion region that is said drain of said third transistor is adjacent to said first diffusion region and said second diffusion region in the row direction on the boundary between on the second ends.

7. The combination memory device according to claim 3, wherein said third bit line includes fourth bit lines, and said ROM cell outputs data of plural bits via said fourth bit lines, by outputting data to each of said fourth bit lines, the data determined depending on whether or not said contact is included, said contact connecting said drain of said third transistor to each of said fourth bit lines.

8. The combination memory device according to claim 7, wherein said ROM cell outputs, to said fourth bit lines, data of plural bits which is determined depending on: whether or not said contact is included; and to which one of said fourth bit lines said contact connects said drain of said third transistor, said ROM cell including at most one of said contacts.

9. The combination memory device according to claim 8, wherein said fourth bit lines are three bit lines, and said ROM cell outputs, to said fourth bit lines that are the three bit lines, 3-bit data in four patterns determined depending on: whether or not said contact is included; and to which one of said three fourth bit lines said contact connects said drain of said third transistor, said ROM cell including at most one of said contacts.

10. The combination memory device according to claim 7, wherein said first bit line and said second bit line comprise a first metal wiring layer, and said fourth bit lines comprise a second metal wiring layer that is different from the first metal wiring layer.

11. The combination memory device according to claim 7, further comprising:

sense amplifiers provided for each of said fourth bit lines, each of said sense amplifiers amplifying data of a corresponding one of said fourth bit lines; and an encoding circuit which encodes the data of plural bits so that the number of bits decreases, the data having been amplified by said sense amplifiers.

12. The combination memory device according to claim 2, further comprising:

a RAM column selection circuit which selects, from among sets of said first bit lines and said second bit lines, a set corresponding to an address input from outside;

a RAM reading circuit which amplifies a signal of the set of said first bit lines and said second bit lines selected by said RAM column selection circuit;

a RAM writing circuit which provides the set of said first bit lines and said second bit lines that has been selected by said RAM column selection circuit with a signal corresponding to writing data;

a ROM column selection circuit which selects, from among said third bit lines, said third bit line corresponding to the address; and a ROM reading circuit which amplifies a signal of said third bit line selected by said ROM column selection circuit, wherein said RAM column selection circuit selects none of the sets of said first bit lines and said second bit lines during a time when one of said third bit lines is selected by said ROM column selection circuit, and said ROM column selection circuit selects none of said third bit lines during a time when one of the sets of said first bit lines and said second bit lines is selected by said RAM column selection circuit.

13. The combination memory device according to claim 2, further comprising:
a timing circuit which activates said word line at a time of: data writing onto said SRAM cell; data reading from said SRAM cell; and data reading from said ROM cell, for different amount times.

14. The combination memory device according to claim 2, wherein said ROM cell outputs, to said third bit line, data determined depending on:
(i) whether or not a third transistor having a source to which a GND is connected, a gate to which said word line is connected, and said third bit line to which a drain is connected, is included, or
(ii) whether or not said third transistor and a diffusion region are included, said third transistor having a gate to which said word line is connected and said third bit line to which a drain is connected, said diffusion region connecting the GND to said source of said third transistor.

15. A semiconductor device comprising
a flash memory; and
a combination memory device comprising first memory cells and second memory cells arranged in rows and columns,
wherein each of said first memory cells includes an SRAM cell and a ROM cell and is arranged adjacent to at least one of said second memory cells,
each of said second memory cells includes an SRAM cell and does not include a ROM cell,
each of said first memory cells and each of said second memory cells are placed alternately in a row direction and in a column direction, and
each of said ROM cells included in said combination memory device stores a loader program for writing data onto said flash memory.

16. The semiconductor device according to claim 15, wherein the combination memory device further comprises:
a word line provided for each row for selecting said SRAM cells and said ROM cells in the row;
a first bit line and a second bit line each provided for each column, for reading data from said SRAM cells in the column and for writing data on said SRAM cells; and
a third bit line provided for each column for reading data from said ROM cells in the column.

17. The semiconductor device according to claim 16, wherein said SRAM cell includes:
a first inverter having an input terminal connected to a first node, and an output terminal connected to a second node;
a second inverter having an input terminal connected to the second node, and an output terminal connected to the first node;
a first transistor having a first terminal connected to the first node, a second terminal connected to said first bit line, and a gate connected to said word line, said first terminal being one of a drain and a source, said second terminal being the other of the drain and the source; and
a second transistor having a first terminal connected to the second node, a second terminal connected to said second bit line, and a gate connected to said word line, said first terminal being one of a drain and a source, said second terminal being the other of the drain and the source, and
wherein said ROM cell includes a third transistor having a source connected to a ground (GND), and a gate connected to said word line, and
said ROM cell outputs, to said third bit line, data determined depending on whether or not a contact is included, said contact connecting said drain of said third transistor to said third bit line.

18. The semiconductor device according to claim 16, wherein the combination memory device further comprises:
a RAM column selection circuit which selects, from among sets of said first bit lines and said second bit lines, a set corresponding to an address input from outside;
a RAM reading circuit which amplifies a signal of the set of said first bit lines and said second bit lines selected by said RAM column selection circuit;
a RAM writing circuit which provides the set of said first bit lines and said second bit lines that has been selected by said RAM column selection circuit with a signal corresponding to writing data;
a ROM column selection circuit which selects, from among said third bit lines, said third bit line corresponding to the address; and
a ROM reading circuit which amplifies a signal of said third bit line selected by said ROM column selection circuit,
wherein said RAM column selection circuit selects none of the sets of said first bit lines and said second bit lines during a time when one of said third bit lines is selected by said ROM column selection circuit, and
said ROM column selection circuit selects none of said third bit lines during a time when one of the sets of said first bit lines and said second bit lines is selected by said RAM column selection circuit.

19. The semiconductor device according to claim 16, wherein the combination memory device further comprises:
a timing circuit which activates said word line at a time of: data writing onto said SRAM cell; data reading from said SRAM cell; and data reading from said ROM cell, for different amount times.

20. The combination memory device according to claim 16,
wherein said ROM cell outputs, to said third bit line, data determined depending on:

(i) whether or not a third transistor having a source to which a GND is connected, a gate to which said word line is connected, and said third bit line to which a drain is connected, is included, or (ii) whether or not said third transistor and a diffusion region are included, said third transistor having a gate to which said word line is connected and said third bit line to which a drain is connected, said diffusion region connecting the GND to said source of said third transistor.

* * * * *